US012389776B2

(12) United States Patent
Xing et al.

(10) Patent No.: US 12,389,776 B2
(45) Date of Patent: Aug. 12, 2025

(54) DISPLAY PANEL AND DISPLAY DEVICE

(71) Applicant: Xiamen Tianma Display Technology Co., Ltd., Xiamen (CN)

(72) Inventors: Xiaoting Xing, Xiamen (CN); Fenxiang Zou, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 491 days.

(21) Appl. No.: 18/087,691

(22) Filed: Dec. 22, 2022

(65) Prior Publication Data

US 2024/0081117 A1 Mar. 7, 2024

(30) Foreign Application Priority Data

Sep. 6, 2022 (CN) .......................... 202211084748.5

(51) Int. Cl.
*H10K 59/131* (2023.01)
(52) U.S. Cl.
CPC ................................ *H10K 59/1315* (2023.02)
(58) Field of Classification Search
CPC ...................................... H10K 59/1315
USPC .......................................... 257/91
See application file for complete search history.

(56) References Cited

U.S. PATENT DOCUMENTS

| | | | | |
|---|---|---|---|---|
| 2020/0159350 A1* | 5/2020 | Yang | ...................... | G06F 3/044 |
| 2022/0391041 A1* | 12/2022 | Kang | .................... | G06F 3/0446 |
| 2023/0147261 A1* | 5/2023 | Zhang | ................. | G06F 3/04164 |
| | | | | 345/173 |

* cited by examiner

*Primary Examiner* — Xia L Cross
(74) *Attorney, Agent, or Firm* — Anova Law Group, PLLC

(57) ABSTRACT

A display panel includes a display area, a non-display area surrounding the display area and including a bending area, and a power line that includes an extension part located at least partially in the bending area and a body part located in the non-display area and electrically connected to the extension part. The body part is located between the bending area and the display area. The display area includes first and second boundaries opposite to each other in a first direction, and a centerline extending in a second direction pointing from the display area to the bending area and intersecting the first direction. In the first direction, a minimum distance between the extension part and the first boundary is smaller than a minimum distance between the extension part and the second boundary and is smaller than or equal to a minimum distance between the extension part and the centerline.

20 Claims, 14 Drawing Sheets

DISPLAY PANEL AND DISPLAY DEVICE

CROSS-REFERENCE TO RELATED APPLICATION

This application claims priority to Chinese Application No. 202211084748.5, filed on Sep. 6, 2022, the entire content of which is incorporated herein by reference.

TECHNICAL FIELD

The present disclosure relates to the technical field of display technology and, more specifically, to a display panel and a display device.

BACKGROUND

In a display panel, the power signal needs to be supplied to the display pixels through a power line. However, there is an IR drop (voltage drop) on the power line, which results in inconsistent brightness of the display pixels at different positions, and poor brightness uniformity of the display panel.

SUMMARY

One aspect of the present disclosure provides a display panel including a display area including a plurality of pixels, a non-display area surrounding the display area and including a bending area located on a first side of the display area, and a power line configured to provide a power signal to the plurality of pixels in the display area. The power line includes an extension part located at least partially in the bending area and a body part located in the non-display area and electrically connected to the extension part. The body part is located between the bending area and the display area. The display area includes a first boundary and a second boundary opposite to each other in a first direction, and a centerline extending in a second direction pointing from the display area to the bending area and intersecting the first direction. In the first direction, a minimum distance d1 between the extension part and the first boundary is smaller than a minimum distance d2 between the extension part and the second boundary.

Another aspect of the present disclosure provides a display device including a display panel. The display panel includes a display area including a plurality of pixels, a non-display area surrounding the display area and including a bending area located on a first side of the display area, and a power line configured to provide a power signal to the plurality of pixels in the display area. The power line includes an extension part located at least partially in the bending area and a body part located in the non-display area and electrically connected to the extension part. The body part is located between the bending area and the display area. The display area includes a first boundary and a second boundary opposite to each other in a first direction, and a centerline extending in a second direction pointing from the display area to the bending area and intersecting the first direction. In the first direction, a minimum distance d1 between the extension part and the first boundary is smaller than a minimum distance d2 between the extension part and the second boundary.

BRIEF DESCRIPTION OF THE DRAWINGS

In order to illustrate the technical solutions in accordance with the embodiments of the present disclosure more clearly, the accompanying drawings to be used for describing the embodiments are introduced briefly in the following. It is apparent that the accompanying drawings in the following description are only some embodiments of the present disclosure. Persons of ordinary skill in the art can obtain other accompanying drawings in accordance with the accompanying drawings without any creative efforts.

DETAILED DESCRIPTION OF THE EMBODIMENTS

Technical solutions of the present disclosure will be described in detail with reference to the drawings, in which the same numbers refer to the same or similar elements unless otherwise specified. It will be appreciated that the described embodiments represent some, rather than all, of the embodiments of the present disclosure. Other embodiments conceived or derived by those having ordinary skills in the art based on the described embodiments without inventive efforts should fall within the scope of the present disclosure.

Many specific details are provided in the following description, so as to facilitate the full comprehension of the disclosure. However, the disclosure may be implemented by using other methods different from the methods described herein; and those skilled in the art can make similar extension without departing from the conception of the present disclosure. Therefore, the present disclosure is not limited to the following disclosed specific implementations.

Moreover, the present disclosure is described in detail with reference to the schematic diagrams, and when expatiating the embodiments of the present disclosure, to facilitate the description, the cross-sectional views showing device structures will be partially enlarged not according to the general proportion, but they should not be construed as limitations of the present disclosure. In addition, during actual manufacturing, the sizes in three dimensions, that is, length, width, and depth, should be included.

As described above, in a display panel, the power signal needs to be supplied to the display pixels through a power line. However, there is an IR drop (voltage drop) on the power line, which results in inconsistent brightness of the display pixels at different positions, and poor brightness uniformity of the display panel.

Figure 1:
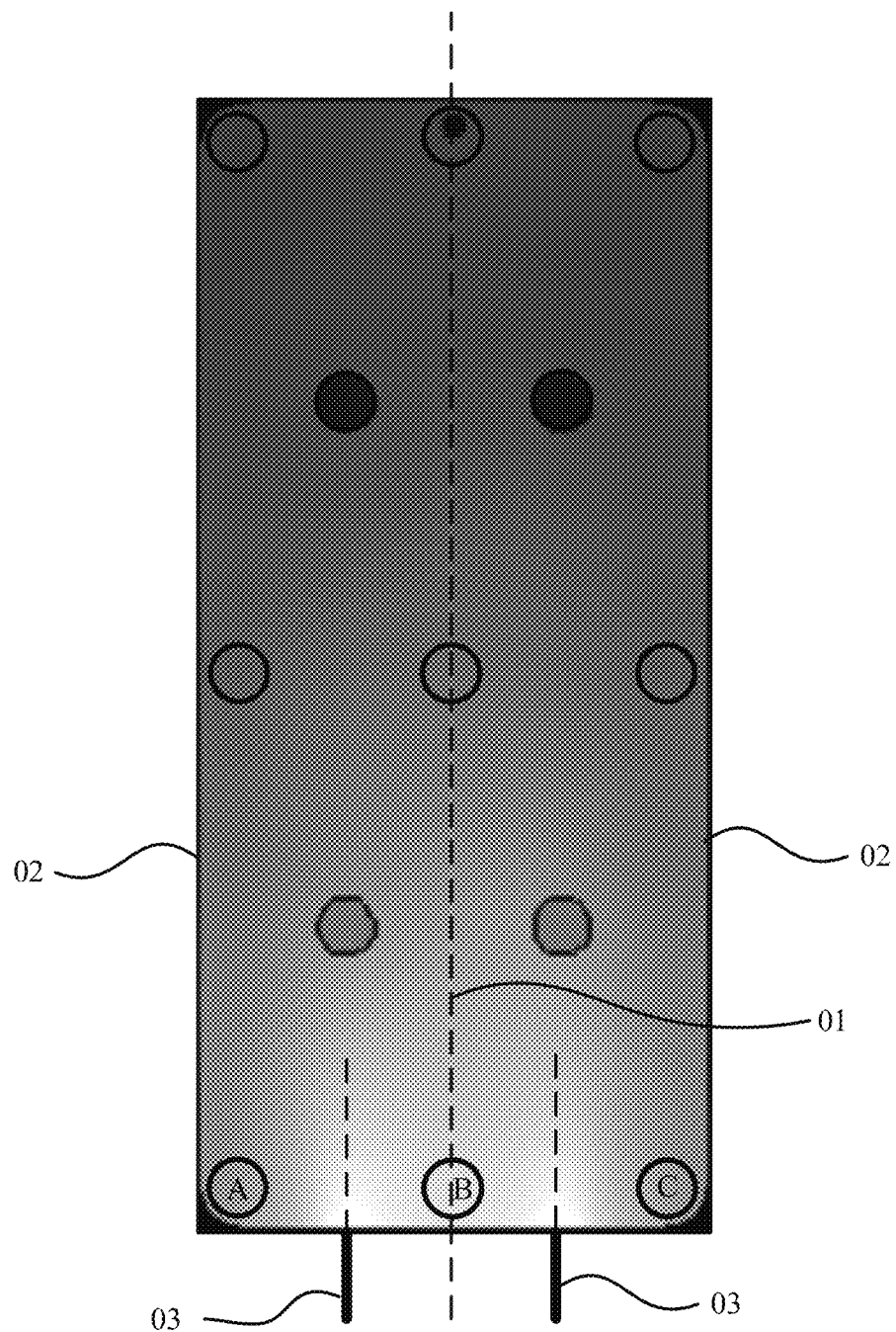
FIG. 1 is a schematic diagram showing an overall brightness of a display area in a conventional display panel.

FIG. 1 is a schematic diagram showing an overall brightness of a display area in a conventional display panel, where the positions marked by the thirteen circles are the luminance test points. As shown in FIG. 1, the upper portion of the display area is dark and the lower portion is bright, there is a difference in brightness, and the difference in brightness at the lower portion of the display area is more obvious. More specifically, at the lower portion of the display area, the area near a centerline 01 of the display area is relatively bright, while the area near two sides 02 of the display area is relatively dark. The brightness of different positions of the display area is inconsistent, which affects the display effect of the display area.

Figure 2:
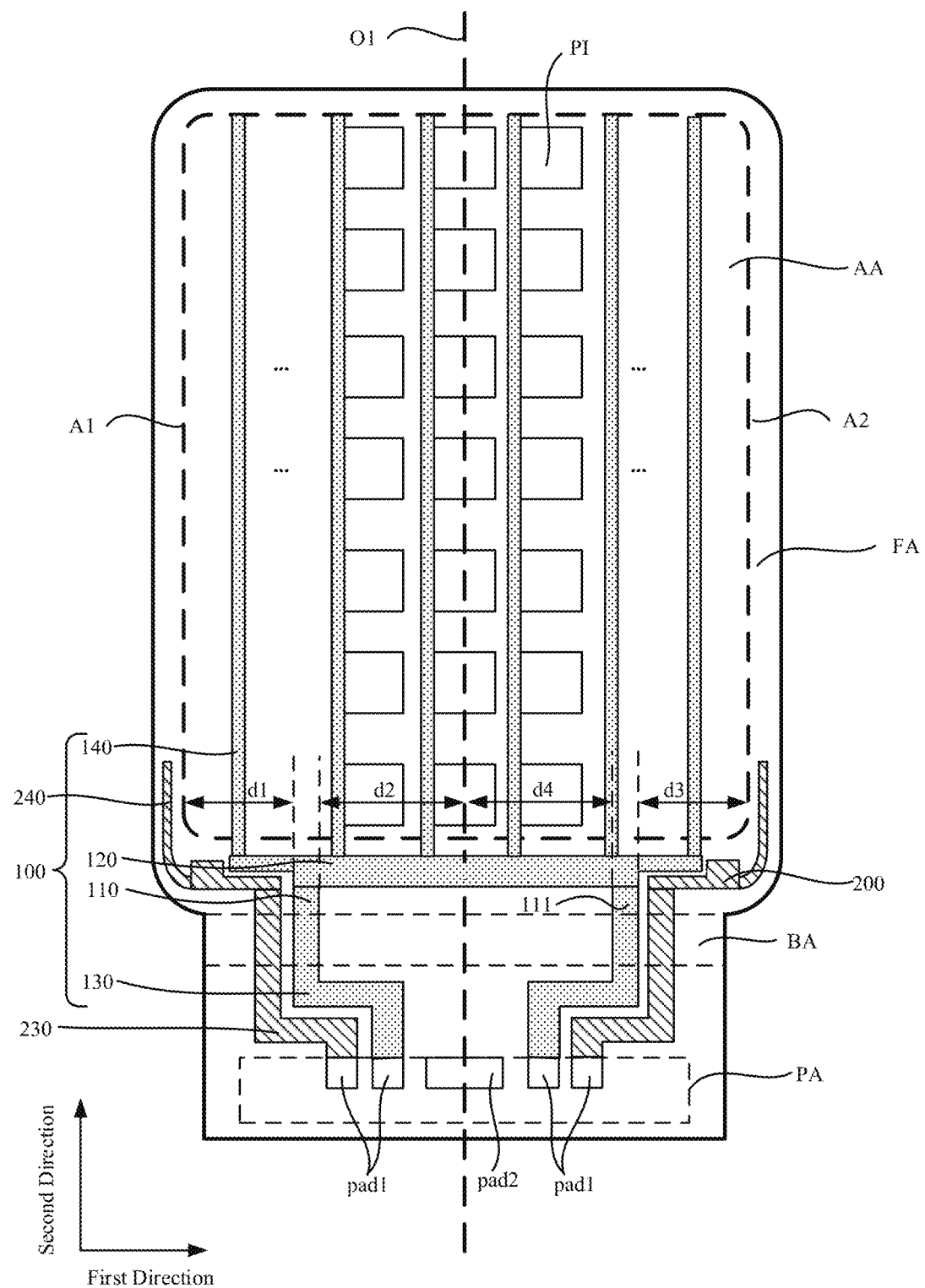
FIG. 2 is a schematic plan view of a display panel according to an embodiment of the present disclosure.

In view of the foregoing, embodiments of the present disclosure provide a display panel. FIG. 2 is a schematic plan view of a display panel according to an embodiment of the present disclosure. As shown in FIG. 2, the display panel includes a display area AA and a non-display area FA located at the periphery of the display area AA. In some embodiments, the non-display area FA may surround the display area AA. The display area AA includes a plurality of pixels PI, the non-display area FA includes a bending area BA, and the bending area BA is located on a first side of the display area AA. The non-display area FA further includes a pad area PA. The pad area PA is also located on the first side of the display area AA, and the pad area PA is located on the side of the bending area BA away from the display area AA. The pad area PA includes a plurality of pads, such a power pad pad1, a data pad pad2, etc. After the display panel is fabricated, a driver integrate circuit (IC) may be connected to the power pad pad1 and the data pad pad2 in the pad area PA and other pads via bonding.

Figure 3:
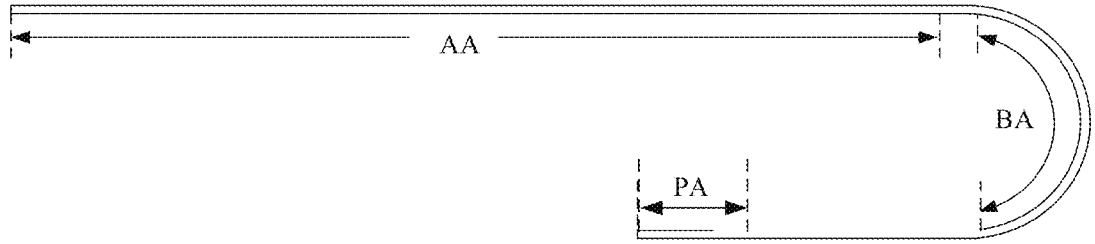
FIG. 3 is a schematic cross-sectional view of a display panel according to an embodiment of the present disclosure.

FIG. 3 is a schematic cross-sectional view of the display panel according to an embodiment of the present disclosure. As shown in FIG. 3, the display panel can be bent at the bending area BA, such that the pad area PA can be bent to the back of the display panel.

Figure 4:
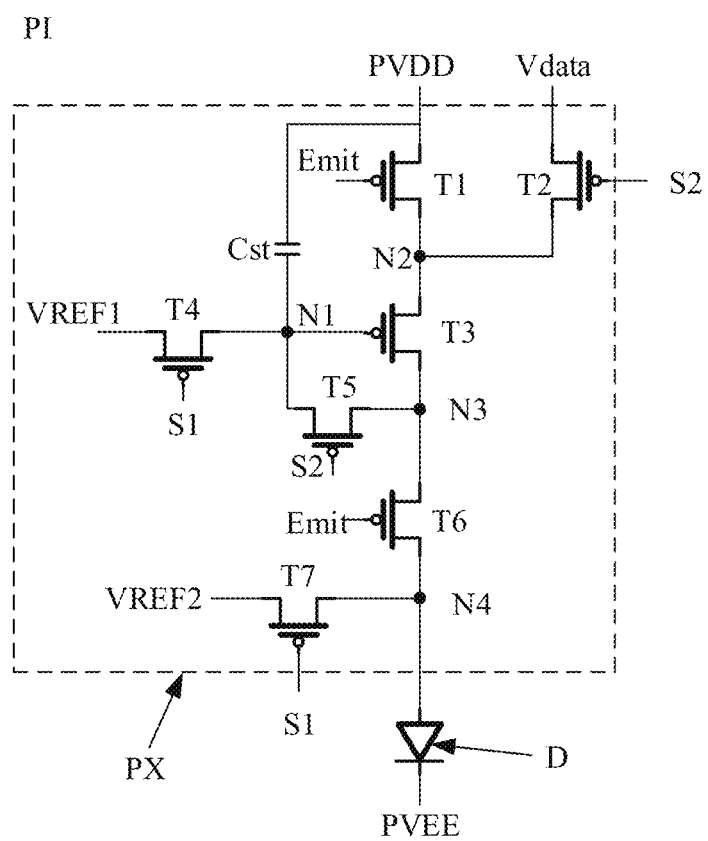
FIG. 4 is a schematic circuit diagram of a pixel.

FIG. 4 is a schematic circuit diagram of a pixel PI. As shown in FIG. 4, the pixel PI in the display area AA includes a pixel circuit PX and a light-emitting element D. The light-emitting element D may be an organic light-emitting diode (OLED), and the pixel circuit PX may include a plurality of thin film transistors T1-T7 and a capacitor Cst. N1 and N2 represent connection nodes. In order to drive the light-emitting element D to work, the pixel circuit PX needs to receive an anode power signal PVDD, a cathode power signal PVEE, a data signal Vdata, a light-emitting control signal Emit, scanning signals S1 and S2, and reference signals VREF1 and VREF2, etc. The connection methods of the thin film transistors and the signal lines are shown in FIG. 4, which will not be repeated here. Obviously, FIG. 4 only takes the 7T1C pixel circuit structure as an example for illustration. In practical applications, the implementation of the pixel circuit PX can be selected based on requirements, instead of being limited to the 7T1C pixel circuit structure shown in FIG. 4.

From FIG. 2 and FIG. 4, it can be seen that the driver IC can provide the power signal PVEE and the power signal PVDD to the pixels PI in the display area AA through the power pad pad1 in the pad area PA, and provide the data signal Vdata to the pixels PI of the display area AA through the data pad pad2 in the pad area PA. This requires the power pad pad1 and the pixels PI of the display area AA to be connected through a power line, and the data pad pad2 and the pixels PI of the display area AA to be connected through a data line.

Refer to FIG. 2, the display panel provided by the embodiments of the present disclosure includes a first power line 100. The first power line 100 may be configured to provide a first power signal to the pixels PI in the display area.

More specifically, the first power line 100 may be connected to the power pad pad1 of the pad area PA and the pixels PI of the display area AA to transmit the first power signal output by the driving IC bound and connected in the pad area PA to the pixels PI of the display area AA through the power pad pad1 and the first power line 100. In the embodiments of the present disclosure, the first power line may be a PVDD power line, and the first power signal may be a PVDD power signal.

As shown in FIG. 2, the first power line 100 includes a first extension part 110 located at least partially in the bending area BA, and a first body part 120 located in the non-display area FA that may be electrically connected to the first extension part 110. The first body part 120 may be located between the bending area BA and the display area AA.

As shown in FIG. 2, the first power line 100 further includes a first fan-out part 130 located in the non-display area FA that may be electrically connected to the power pad pad1 and the first extension part 110, and a plurality of first auxiliary lines 140 located in the display area AA. In FIG. 2, only some of the plurality of first auxiliary lines 140 are shown for clarity.

That is, the power pad pad1 of the pad area PA is connected to pixels PI of the display area AA through the first fan-out part 130, the first extension part 110, the first body part 120, and the plurality of first auxiliary lines 140 of the first power line 100 connected in sequence.

The difference in brightness on the first side of the display area (corresponding to the lower end of the display area in FIG. 1) mainly depends on the position of the first power line 100 corresponding to the incoming line of the display area AA. More specifically, the first extension part 110 of the first power line 100 extends along the direction from the display area AA to the bending area BA (i.e., the second direction in FIG. 2), and the position of the first extension part 110 in the first direction as shown in FIG. 2 is the position of the first power line 100 corresponding to the incoming line of the display area AA (i.e., the power line 03 in FIG. 1 corresponds to the incoming line position of the display area). In the first direction in FIG. 2, the closer the pixel on the first side of the display area to the first extension part 110, the smaller the voltage drop loss on the first power line 100 and the brighter the pixel brightness. Conversely, the farther the pixel from the first side of the display area is from the first extension part 110, the greater the voltage drop loss on the first power line 100, and the darker the pixel brightness.

In the display panel shown in FIG. 1, the incoming position of the power line 03 at the lower end of the display area is closer to the centerline 01 of the display area. As a result, the brightness of the pixels at the lower end of the display area near the sides 02 of the display area is lower, while the brightness of the pixels at the lower end of the display area closer to the centerline 01 of the display area is higher. In addition, the brightness of the pixels at the lower end of the display area located on two sides of the centerline of the display area will also overlap each other, which leads to higher brightness in an area at the lower end of the display area located at the centerline 01 of the display area. As such, at the lower end of the display area, the difference in the brightness between the area at the centerline 01 and the areas at the two sides 02 of the display area becomes even greater, the brightness of different positions in the horizontal direction of the lower end of the display area is relatively large, and the overall brightness uniformity of the display area is poor. In addition, in the display panel shown in FIG. 1, the upper end of the display area is farther from the incoming position of the power line 03, and the voltage drop on the power line 03 is larger, such that upper end of the display area is dark and the lower end is bright.

In view of the foregoing, as shown in FIG. 2, in the display panel provided by the embodiments of the present disclosure, the display area AA includes a first boundary A1 and a second boundary A2 opposite to each other in the first direction, and the first direction intersects the direction from the display area AA to the bending area BA. The display area AA further includes a first centerline O1, and the first centerline O1 extends along the direction from the display area AA to the bending area BA (i.e., the second direction in FIG. 2). In the first direction, the distance between the first centerline O1 and the first boundary A1 may be equal to the distance between the first centerline O1 and the second boundary A2.

As shown in FIG. 2, in the first direction, the minimum distance between the first extension part 110 and the first boundary A1 may be smaller than the minimum distance between the first extension part 110 and the second boundary A2. That is, in the first direction, the first extension part 110 is located between the first boundary A1 and the first centerline O1. The minimum distance between the first extension part 110 and the first boundary A1 is the first distance d1, and the minimum distance between the first extension part 110 and the first centerline O1 is the second distance d2, where d1≤d2.

The number of the first extension part 110 may not be limited to one. That is, in the first direction, between the first boundary A1 and the first centerline O1, there may be one, two, or even multiple first extension parts 110, and the minimum distance d1 between each first extension part 110 and the first boundary A1 may be less than or equal to the minimum distance d2 between the first extension part 110 and the first centerline O1.

For the conventional display panel, the first extension part 110 is closer to the first centerline O1 in the first direction, that is, d1>d2. As a result, the brightness of the pixels on the first side of the display area near the first boundary A1 is low, and the brightness of the pixels on the first side of the display area near the first centerline O1 is high. In addition, the brightness of the pixels located on the first side of the display area and on two sides of the first centerline O1 will be superimposed near the first centerline O1. As a result, the brightness near the first centerline O1 on the first side of the display area is higher, the brightness difference near the first centerline O1 on the first side of the display area and the vicinity of the first boundary A1 is larger, and the overall brightness uniformity of the display area is poor.

In the display panel provided by the embodiments of the present disclosure, the minimum distance d1 between the first extension part 110 and the first boundary A1 is set to be less than or equal to the minimum distance d2 between the first extension part 110 and the first centerline O1, that is, d1≤d2. In this way, the distance between the pixels on the first side of the display area near the first boundary A1 and the first extension part 110 is reduced, the voltage drop from the first extension part 110 to the pixels on the first side of the display area near the first boundary A1 is reduced, and the brightness of the pixels on the first side of the display area near the first boundary A1 is improved. In addition, since the brightness of the pixels located on the first side of the display area and on two sides of the first centerline O1 will be superimposed near the first centerline O1, even if d1<d2, the brightness near the first centerline O1 on the first side of the display area and the vicinity of the first boundary A1 can be equalized, thereby improving the brightness uniformity of the entire display area.

As shown in FIG. 2, in a portion of the non-display area FA between the pad area PA and the display area AA (including the bending area BA), not only the first power line 100 is provided to provide the first power signal to the pixels PI in the display area AA, but also other power lines are provided, such as a second power line 200 in FIG. 2 used to provide a second power signal to the pixels PI in the display area AA, and a data signal line (not shown in FIG. 2) used to provide a data signal to the pixels PI in the display area AA. Therefore, considering the actual wiring space, in one embodiment of the present disclosure, the first distance d1 and the second distance d2 may satisfy the following condition: 0.7≤d1/d2≤1.

When d1/d2=1, that is d1=d2, compared with the conventional display panel, in the display panel provided by this embodiment, d1 is decreased, and d2 is increased. Since d1 is decreased, the brightness of the pixels on the first side of the display area near the first boundary A1 can be improved. Although the increase of d2 reduces the brightness of the pixels on the first side of the display area near the first centerline O1, since d1=d2, the brightness of the pixels on the first side of the display area near the first centerline O1 and the pixels on the first side of the display area near the first boundary A1 may be equivalent. However, since the brightness of the pixels located on the first side of the display area and on two sides of the first centerline O1 will be superimposed near the first centerline O1, the brightness near the first centerline O1 on the first side of the display area may still be higher than the brightness near the first boundary A1 on the first side of the display area. However, compared to the conventional display panel, in the display panel provided by this embodiment, the difference between the brightness near the first centerline O1 on the first side of the display area and the brightness near the first boundary A1 on the first side of the display area is reduced, and the overall brightness uniformity of the display area is improved.

When d1/d2<1, that is d1<d2, compared with the conventional display panel, in the display panel provided by this embodiment, as d1/d2 decreases, d1 continues to decrease, d2 continues to increase, the brightness of the pixels on the first side of the display area near the first boundary A1 can continue to increase, and the brightness of the pixels on the first side of the display area near the first centerline O1 can continue to decrease. Since d1<d2, the brightness of the pixels on the first side of the display area close to the first boundary A1 may be higher than the brightness of the pixels on the first side of the display area near the first centerline O1. However, since the brightness of the pixels on the first side of the display area and on two sides of the first centerline O1 will be superimposed near the first centerline O1, even if d1<d2, the brightness near the first centerline O1 on the first side of the display area may be equivalent to the brightness near the first boundary A1 on the first side of the display area, which further reduces the difference between the brightness near the first centerline O1 on the first side of the display area and the brightness near the first boundary A1 on the first side of the display area, and improves the brightness uniformity of the entire display area.

As d1/d2 continues to decrease, when the brightness of the pixels on the first side of the display area near the first boundary A1 and the brightness of the pixels on the two sides of the first centerline O1 on the first side of the display area after the brightness superimpose near the first centerline O1 is equivalent, the difference between the brightness near the first centerline O1 on the first side of the display area and the brightness near the first boundary A1 on the first side of the display area may be the smallest, and the overall brightness uniformity of the display area may be optimal.

In some embodiments, limited by the wiring space, for example, as shown in FIG. 2, in the first direction, the second power line 200 needs to be provided on the side of the first extension part 110 near the first boundary A1 in the first direction, d1/d2≥0.7. That is, d1 cannot further decrease, and the first extension part 110 cannot continue to approach the first boundary A1 in the first direction.

In some embodiments, when d1/d2=0.7, the brightness of the pixels on two sides of the first centerline O1 on the first side of the display area after being superimposed near the first centerline O1 may still be higher than the brightness of the pixels on the first side of the display area near the first boundary A1. That is, as d1/d2 decreases from 1 to 0.7, the difference between the brightness near the first centerline O1 on the first side of the display area and the brightness near the first boundary A1 on the first side of the display area may gradually decrease, and the overall brightness uniformity of the display area may gradually increase.

More specifically, a brightness test of the 13 points (the 13 brightness test points shown in FIG. 1) is performed on the display area of the display panel provided in this embodiment, and the result shows that as d1/d2 decreases from 1 to 0.7, the brightness difference among the three points A, B, and C on the first side of the display area (the three points A, B, and C shown in FIG. 1) decreases from 5.76% to 1.10%, and the overall brightness uniformity of the display area increases from 86.36% to 88.62%.

Consistent with the present disclosure, by setting the position of the first extension part 110 near the first boundary A1, the difference between the brightness near the first centerline O1 on the first side of the display area and the brightness near the first boundary A1 on the first side of the display area can be reduced, and the overall brightness uniformity of the display area can be improved. Similarly, there is also a difference between the brightness near the first centerline O1 on the first side of the display area and the brightness near the second boundary A2 on the first side of the display area. Based on this, optionally, in one embodiment of the present disclosure, as shown in FIG. 2, the first power line 100 further includes a second extension part 111 located at least partially in the bending area BA, and the second extension part 111 may be electrically connected to the first body part 120.

In the first direction, the minimum distance between the second extension part 111 and the first boundary A1 may be greater than the minimum distance between the second extension part 111 and the second boundary A2. That is, in the first direction, the second extension part 111 may be located between the second boundary A2 and the first centerline O1. The minimum distance between the second extension part 111 and the second boundary A2 may be the third distance d3, and the minimum distance between the second extension part 111 and the first centerline O1 may be the fourth distance d4, where d3≤d4.

In the conventional display panel, the second extension part 111 is also closer to the first centerline O1, that is, d3>d4. As a result, the brightness of the pixels on the first side of the display area close to the second boundary A2 is low, and the brightness of the pixels on the first side of the display area close to the first centerline O1 is high, resulting in a relatively large difference in brightness between vicinity of the first centerline O1 on the first side of the display area and vicinity of the second boundary A2, and the brightness uniformity of the entire display area is poor. In the display panel provided by the embodiments of the present disclosure, the minimum distance d3 between the second extension part 111 and the second boundary A2 may be set to be less than or equal to the minimum distance d4 between the second extension part 111 and the first centerline O1, that is, d3≤d4, thereby reducing the distance between the pixels on the first side of the display area close to the second boundary A2 and the second extension part 111, reducing the voltage drop from the second extension part 111 to the pixels on the first side of the display area close to the second boundary A2, and improving the brightness of the pixels on the first side of the display area close to the second boundary A2. In addition, since the brightness of the pixels on the first side of the display area and on two sides of the first centerline O1 will be superimposed near close to the first centerline, even if d3<d4, the brightness close to the first centerline O1 on the first side of the display area and the brightness close to the second boundary A2 may be equalized, thereby improving the brightness uniformity of the display panel.

Consistent with the present disclosure, the display panel provided by the embodiments of the present disclosure not only can reduce the brightness difference between the vicinity of the first centerline O1 and the vicinity of the first boundary A1 on the first side of the display area by setting d1≤d2, but also can reduce the brightness difference between the vicinity of the first centerline O1 and the vicinity of the second boundary A2 on the first side of the display area by setting d3≤d4. In this way, the brightness difference among different positions on the first side of the display area in the first direction is relatively small, and the brightness uniformity of the entire display area is improved.

On the basis of the above embodiment, in one embodiment, d3 may be set to equal d1. That is, in the first direction, the first extension part 110 and the second extension part 111 may be symmetrically arranged along the first centerline O1, such that the brightness on two sides of the first centerline O1 of the display area can be consistent, and the overall brightness uniformity of the display area can be improved.

In the foregoing embodiments, the number of the second extension part 111 may not be limited to one. That is, in the first direction, between the second boundary A2 and the first centerline O1, there may be one, two, or even multiple second extension parts 111, and the minimum distance d3 between each second extension part 111 and the second boundary A2 may be less than or equal to the minimum distance d4 between the second extension part 111 and the first centerline O1.

Figure 5:
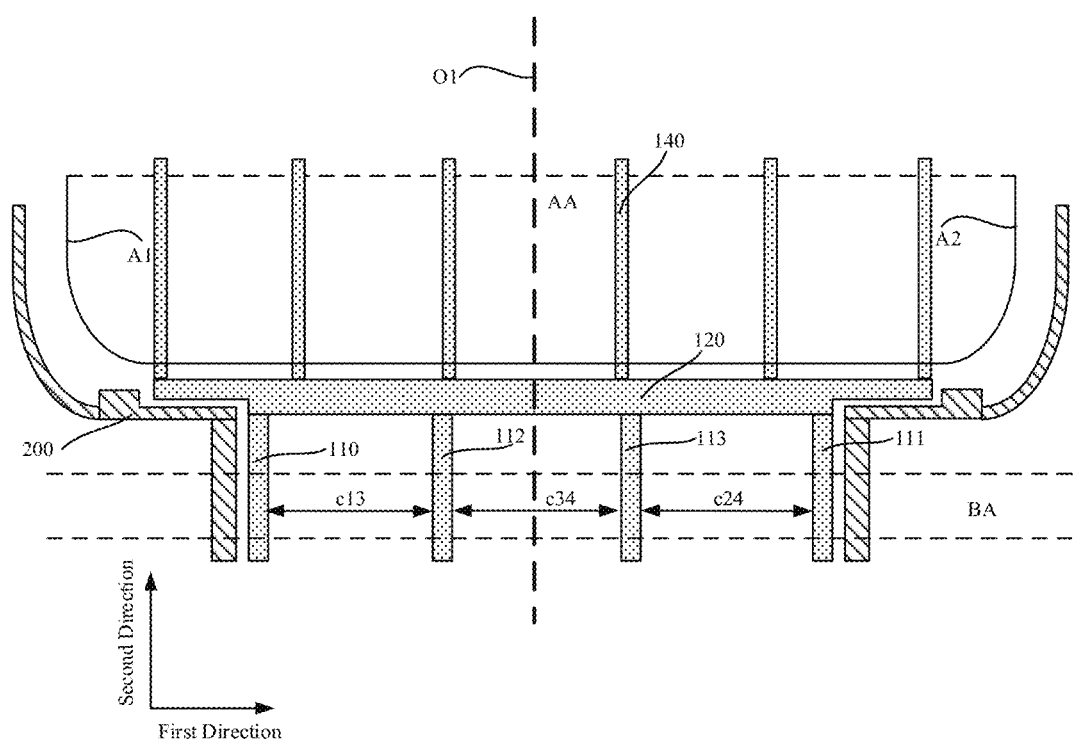
FIG. 5 is an enlarged schematic plan view of a display panel according to an embodiment of the present disclosure.
Figure 6:
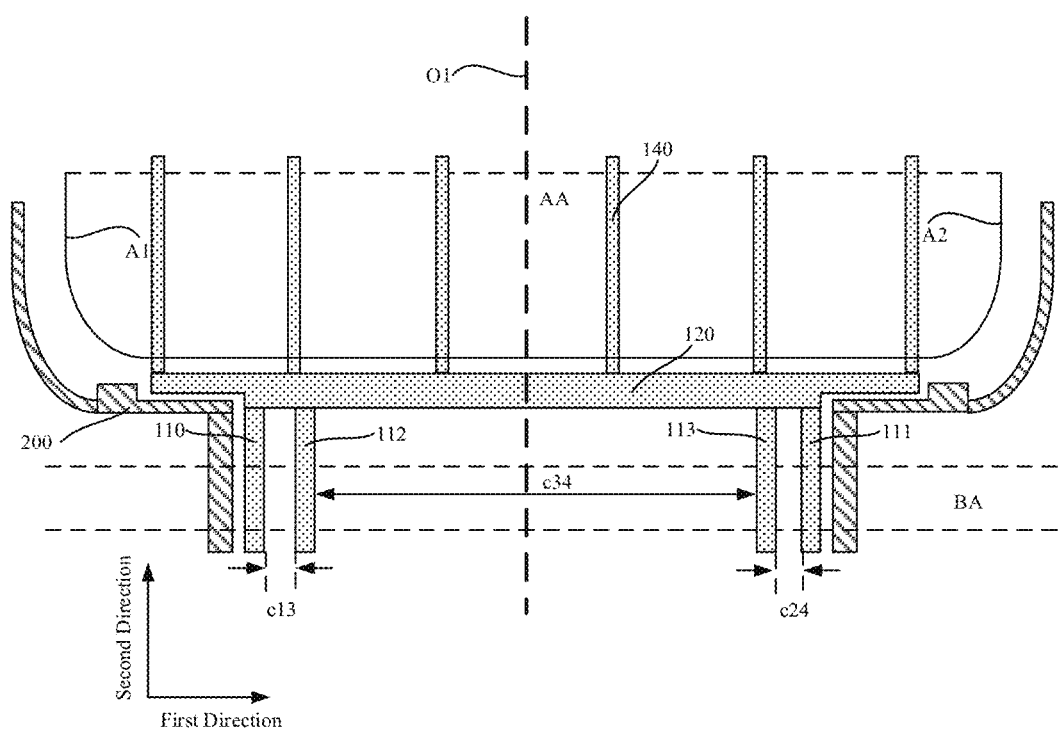
FIG. 6 is an enlarged schematic plan view of the display panel according to an embodiment of the present disclosure.

As shown in FIG. 2, the first power line 100 may include the first extension part 110 and the second extension part 111 that are at least partially located in the bending area BA and extend along the second direction. In this scenario, the first power line 100 may enter the display area by means of two incoming lines. In addition, based on actual needs, the first power line 100 may include multiple extension parts that are at least partially located in the bending area BA and extend along the second direction, as shown in FIG. 5 and FIG. 6. In this scenario, the first power line 100 may enter the display area AA through multiple incoming lines.

In some embodiments, as shown in FIG. 5 and FIG. 6, the first power line 100 further includes a third extension part 112 at least partially located in the bending area BA and a fourth extension part 113 at least partially located in the bending area BA. Both the third extension part 112 and the fourth extension part 113 may be electrically connected to the first body part 120. In the first direction, the third extension part 112 and the fourth extension part 113 may be located between the first extension part 110 and the second extension part 111. The minimum distance $c13$ between the first extension part 110 and the third extension part 112 may be equal to the minimum distance $c24$ between the second extension part 111 and the fourth extension part 113, that is, $c13=c24$.

In this embodiment, the first power line 100 may enter the display area AA through a four-segment incoming line. In the first direction, the first extension part 110, the third extension part 112, the second extension part 111, and the fourth extension part 113 may be arranged symmetrically about the first centerline O1, such that the brightness on two sides of the first centerline O1 of the display area can be equivalent, and the overall brightness uniformity of the display area can be improved.

On the basis of the foregoing embodiments, in one embodiment, as shown in FIG. 5, in the first direction, the minimum distance $c13$ between the first extension part 110 and the third extension part 112, the minimum distance $c34$ between the third extension part 112 and the fourth extension part 113, and the minimum distance $c24$ between the fourth extension part 113 and the second extension part 111 may be equal to each other, that is $c13=c34=c24$.

In this embodiment, in the first direction, the distances between the extension parts are equal, such that the wiring method is relatively simple. In addition, in the first direction, the pixel brightness differences are relatively small among different positions between the first extension part 110 and the second extension part 111 on the first side of the display area. However, the brightness of the pixels on the first side of the display area located between any two adjacent extension parts may be superimposed between the two adjacent extension parts, such that the overall brightness of the area between the first extension part 110 and the second extension part 111 on the first side of the display area may be higher than the brightness of the area between the first extension part 110 and the first boundary A1 on the first side of the display area, and the brightness of the area between the second extension part 111 and the second boundary A2 on the first side of the display area.

In one embodiment, as shown in FIG. 6, in the first direction, the minimum distance $c34$ between the third extension part 112 and the fourth extension part 113 may be greater than the minimum distance $c13$ between the first extension part 110 and the third extension part 112, and greater than the minimum distance $c24$ between the fourth extension part 113 and the second extension part 111, that is, $c34>c13$, and $c34>c24$.

In this embodiment, in the first direction, the distance between two adjacent extension parts near the first centerline O1 is relatively large, and the distance between two adjacent extension parts near the first boundary A1 and the second boundary A2 is relatively small. In this way, the brightness of the pixels near the first boundary A1 and the pixels near the second boundary A2 on the first side of the display area can be further improved, so as to reduce the difference among the brightness at the first side of the display area between the first extension part 110 and the second extension part 111, the brightness at the first side of the display area between the first extension part 110 and the first boundary A1, and the brightness at the first side of the display area between the second extension part 111 and the second boundary A2. However, in this scenario, the distance between the first extension part 110 and the third extension part 112 may be relatively small in the first direction, and the distance between the second extension part 111 and the fourth extension part 113 may be relatively small in the first direction. In this way, the brightness of the area between the first extension part 110 and the third extension part 112 on the first side of the display area and the area between the second extension part 111 and the fourth extension part 113 on the first side of the display area can be higher than the brightness of other areas on the first side of the display area.

In this embodiment, in the first direction, the minimum distance between the third extension part 112 and the first boundary A1 may be less than or equal to the minimum distance between the third extension part 112 and the first centerline O1, or greater than the minimum distance between the third extension part 112 and the first centerline O1.

Similarly, in the first direction, the minimum distance between the fourth extension part 113 and the second boundary A2 may be less than or equal to the minimum distance between the fourth extension part 113 and the first centerline O1, or greater than the minimum distance between the fourth extension part 113 and the first centerline O1.

The above embodiment only shows the case where the first power line 100 includes four extension parts at least partially located in the bending area BA and extending along the second direction. In practical applications, the first power line 100 may be designed to include three, five, or even more extension parts located at least partially in the bending area BA and extending along the second direction.

In addition, since various signal lines (such as power lines and data lines) all need to pass through the bending area BA, the total width of the part of the first power line 100 located in the bending area BA in the first direction is fixed due to the limitation of the wiring space. That is, the total width in the first direction of various extension parts (including the first extension part 110, the second extension part 111, and other extension parts) of the first power line 100 extending along the second direction is fixed. Therefore, the greater the number of extension parts extending along the second direction in the first power line 100, the smaller the width of each extension part in the first direction becomes. In this way, the resistance of each extension part will increase, the voltage drop loss on the first power line 100 will increase, and the brightness uniformity of the entire display area will be slightly affected. Therefore, a two-part lead-in method for the first power line 100 may be better than multi-part lead-in method in terms of improving the brightness uniformity of the display area.

Although the two-part lead-in method for the first power line 100 may be more beneficial in improving the brightness uniformity of the display area than the multi-part lead-in method, in the display panel provided by the embodiments of the present disclosure, when the first power line 100 adopts the multi-part lead-in method, since d1≤d2, and/or d3≤d4, the brightness difference among different positions on the first side of the display area can be reduced, and the overall brightness uniformity of the display area can be improved.

Due to the limitation of the wiring space, the total width of the extension parts of the first power line 100 in the first direction is constant. On the basis that the first power line 100 includes the first extension part 110 and the second extension part 111, in one embodiment, as shown in FIG. 7, in the first direction, the width of the first extension part 110 and the width of the second extension part 111 may be the same, and both may be a1.

Figure 8A:
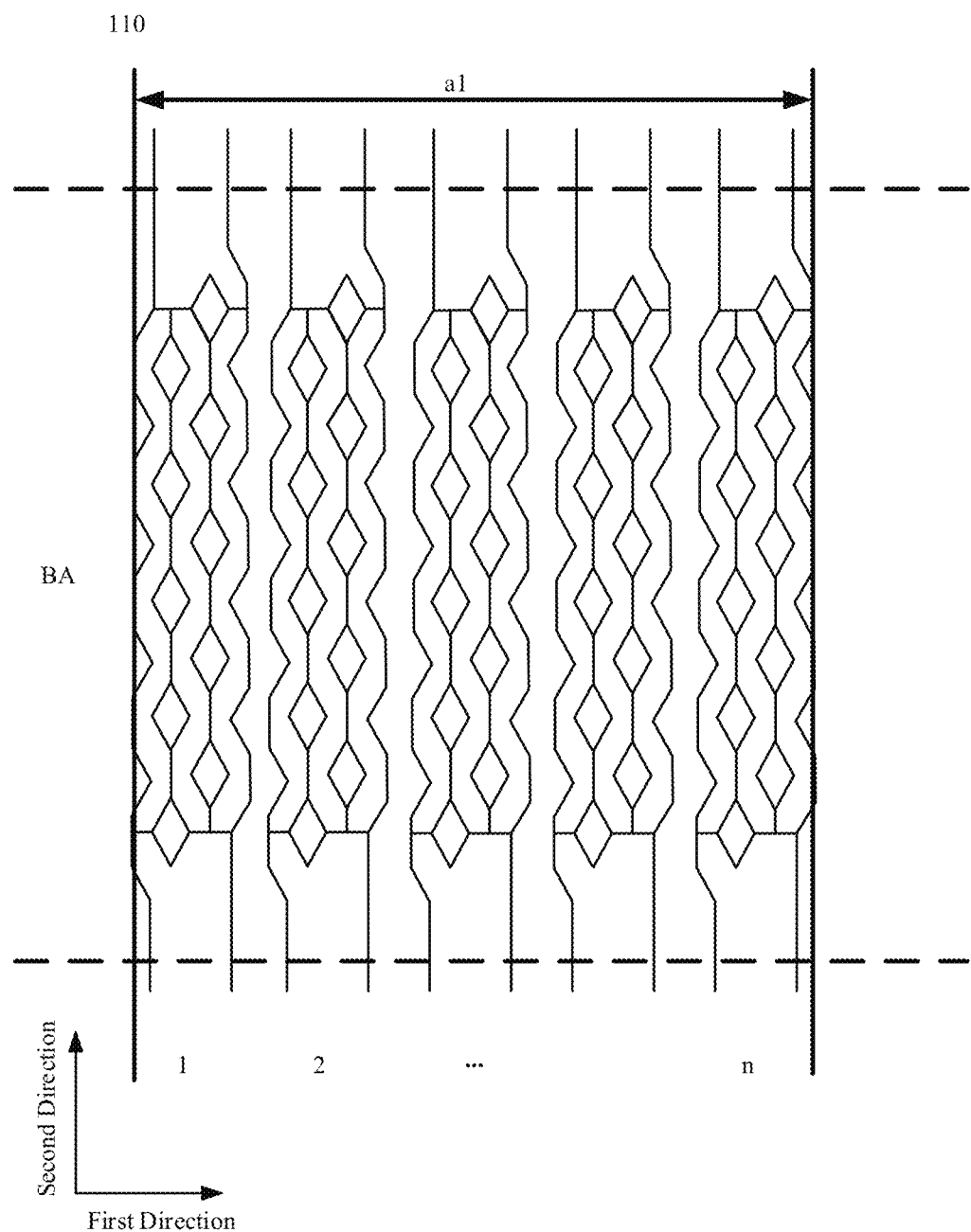
FIG. 8A is an enlarged schematic diagram of a first extension part of the display panel according to an embodiment of the present disclosure.
Figure 8B:
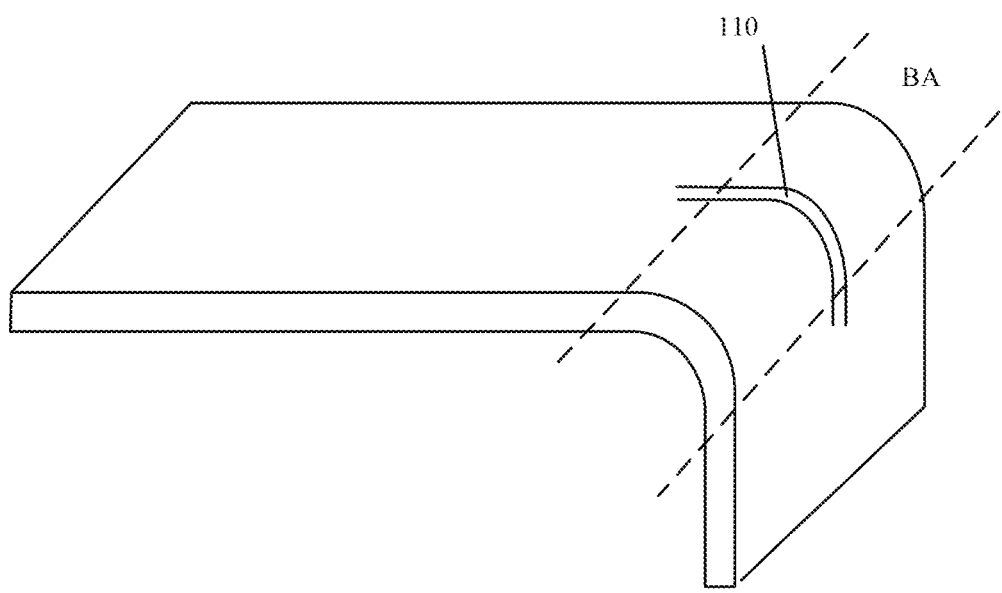
FIG. 8B is a schematic diagram of a part of the first extension part located in the bending area of the display panel according to an embodiment of the present disclosure.

FIG. 8A is an enlarged schematic diagram of the first extension part 110, and FIG. 8B is a schematic diagram showing a part of the first extension part 110 located in the bending area BA. In this disclosure, the part of an extension part located in the bending area BA is also referred to as a "bending part" of the extension part. Refer to FIG. 8A and FIG. 8B, it can be seen that the part of the first extension part 110 located in the bending area BA includes n traces arranged in sequence along the first direction. In the first direction, the distance between the boundary of the first trace away from the nth trace and the boundary of the nth trace away from the first trace is the width a1 of the first extension part 110.

Similarly, as shown in FIG. 8A, the part in the bending area BA of each extension part, extending along the second direction, of the first power line 100 includes a plurality of traces arranged in sequence along the first direction. Based on this, the widths in the first direction of the extension parts of the first power line 100 extending along the second direction can be understood.

Figure 7:
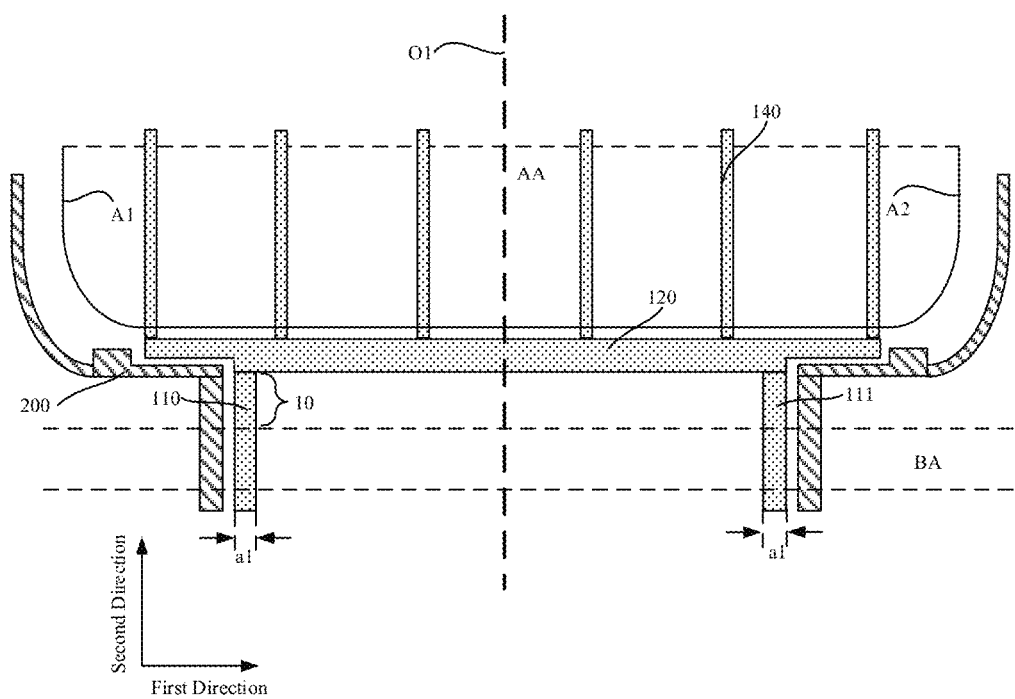
FIG. 7 is an enlarged schematic plan view of a display panel according to another embodiment of the present disclosure.

As shown in FIG. 7, in the second direction, the first extension part 110 includes a first wire entry part 10 located between the bending area BA and the first body part 120. Refer to FIG. 7 and FIG. 8A, the width of the first wire entry part 10 in the first direction is approximately equal to the width of the part of the first extension part 110 located in the bending area BA in the first direction.

Each extension part of the first power line 100 extending along the second direction may include a plurality of wirings arranged in sequence along the first direction. In this way, on the one hand, the stress of the first power line 100 in the bending area BA can be reduced, and on the other hand, the stable transmission of the first power signal in the first power line 100 can be ensured. For example, even if one of the traces located in the bending area BA is broken, other traces can continue to transmit signals.

Further, the parts, located in the bending area BA, of the first power line 100 extending along the second direction may be in the shape of a diamond chain as shown in FIG. 8A, and may alternatively be in the form of an "8"-shaped chain, or chains of other shapes, which is not limited in the embodiments of the present disclosure.

In other embodiments, in the first direction, the width of the first extension part 110 and the width of the second extension part 111 may also be different.

The above-mentioned embodiment is described by taking an example that the first power line 100 includes two extension parts that are at least partially located in the bending area BA and extend along the second direction. In other embodiments of the present disclosure, when the first power line 100 includes a plurality of extension parts that are at least partially located in the bending area BA and extend along the second direction, the extension parts may have the same width, or at least two extension parts may have different widths.

Figure 9:
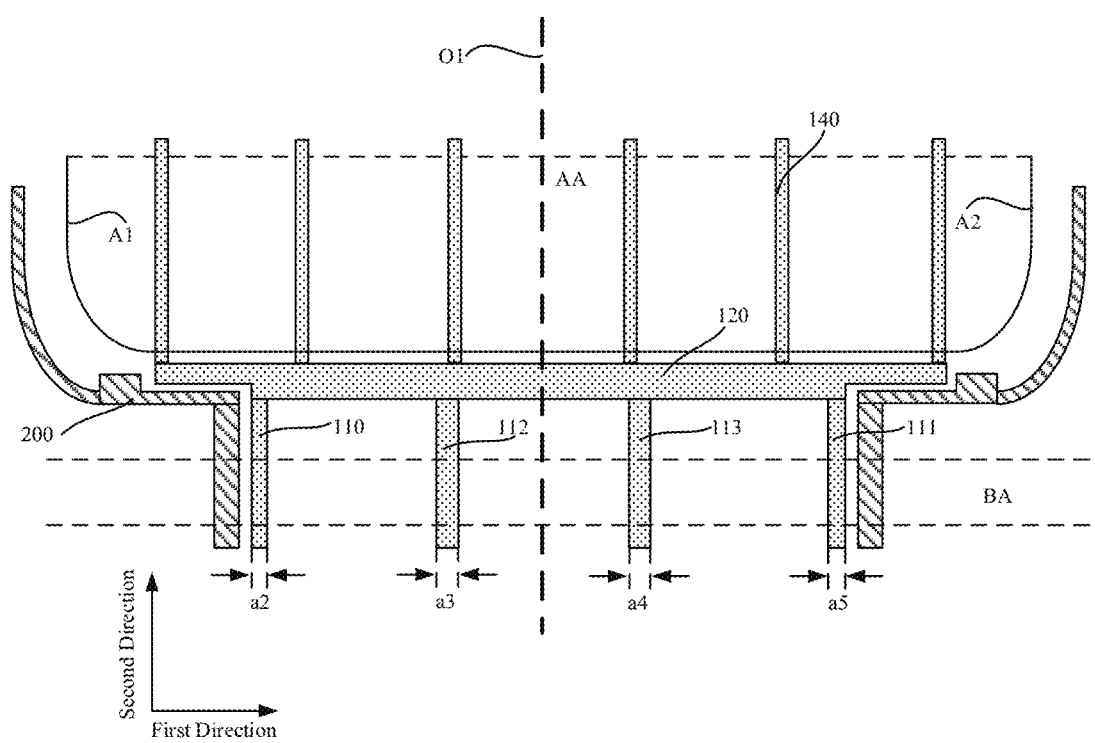
FIG. 9 is an enlarged schematic plan view of a display panel according to another embodiment of the present disclosure.

More specifically, in one embodiment of the present disclosure, as shown in FIG. 9, on the basis that the first power line 100 includes the first extension part 110 and the second extension part 111, the first power line 100 further includes the third extension part 112 at least partially located in the bending area BA and the fourth extension part 113 at least partially located in the bending area BA. Both the third extension part 112 and the fourth extension part 113 may be electrically connected to the first body part 120. In the first direction, the third extension part 112 and the fourth extension part 113 are located between the first extension part 110 and the second extension part 111. In the first direction, the width a3 of the third extension part 112 may be larger than the width a2 of the first extension part 110, and the width a4 of the fourth extension part 113 may be larger than the width a5 of the second extension part 111.

In this embodiment, in the first power line 100, the width of the extension part near the first centerline O1 in the first direction may be relatively large, and the width of the extension part near the first boundary A1 and the second boundary A2 in the first direction may be relatively small.

This embodiment is described by taking the first power line 100 including four extension parts that are at least partially located in the bending area BA and extend along the second direction as an example. When the first power line 100 includes three, five, or more extension parts that are at least partially located in the bending area BA and extend along the second direction, the width of each extension part may be determined based on the wiring space and actual needs.

The following continues the description by taking the first power line 100 including the first extension part 110 and the second extension part 111 that are at least partially located in the bending area BA and extend along the second direction as an example.

As shown in FIG. 2, in order to reduce the pixel brightness difference among different positions on the first side of the display area, the first body part 120 should extend in the first direction as much as possible. However, due to the limitation of the actual process, a certain interval is needed for different signal lines in the same metal layer. It can be seen from FIG. 2 that other signal lines (e.g., the second power line 200) in the same metal layer are also provided on two sides of the first body part 120 in the first direction. That is, the first body part 120 is limited by the wiring space, such that the first body part 120 cannot extend to the first boundary A1 and the second boundary A2 of the display area AA along the first direction without limitation.

Figure 10:
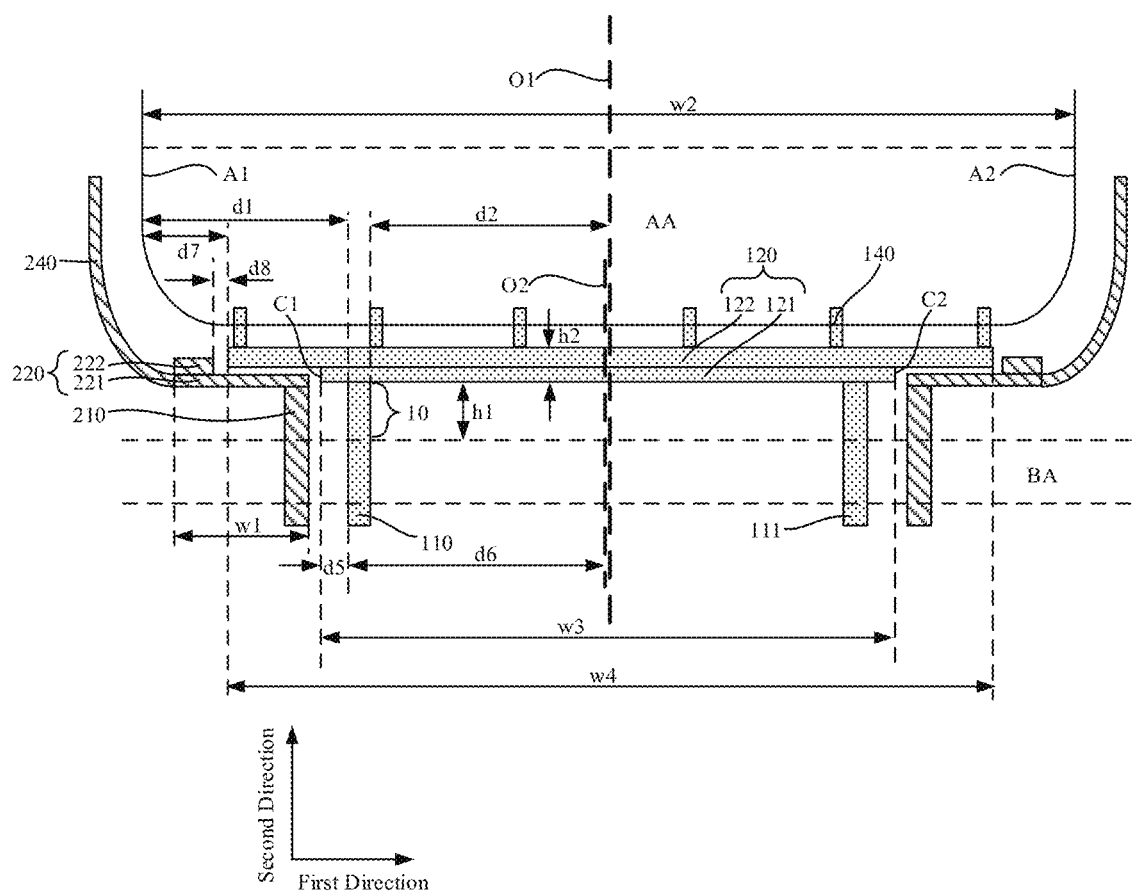
FIG. 10 is an enlarged schematic plan view of a display panel according to another embodiment of the present disclosure.

In one embodiment of the present disclosure, as shown in FIG. 10, the first body part 120 extends in the first direction. The first body part 120 includes a first part 121 and a second part 122 connected to each other in the second direction parallel to the direction from the display area AA to the bending area BA. The second part 122 is located on the side of the first part 121 near the display area AA. In the first direction, the width of the first part 121 is smaller than the width of the second part 122.

The first part 121 includes a third boundary C1 and a fourth boundary C2 that are opposite to each other in the first direction. The third boundary C1 is located on the side of the fourth boundary C2 near the first boundary A1. The first part 121 further includes a second centerline O2 extending in the second direction. In the first direction, the distance between the second centerline O2 and the third boundary C1 may be equal to the distance between the second centerline O2 and the fourth boundary C2.

As shown in FIG. 10, the first extension part 110 needs to be located within the width of the first part 121 in the first direction. In order to make the first extension part 110 as close as possible to the first boundary A1 of the display area AA, in this embodiment, in the first direction, the minimum distance between the first extension part 110 and the third boundary C1 is the fifth distance a5, and the minimum distance between the first extension part 110 and the second centerline O2 is the sixth distance d6, where d5<d6.

Generally, in the first direction, the distance between the first centerline O1 and the second centerline O2 is less than a preset distance, and the first centerline O1 and the second centerline O2 can be regarded as substantially coincident. The following description takes the first centerline O1 and the second centerline O2 overlapping each other as an example.

In the conventional display panel, the first extension part 110 is closer to the second centerline O2, that is d5>d6, such that the first extension part 110 is closer to the first centerline O1, that is d1>d2. As a result, the brightness of the pixels on the first side of the display area near the first boundary A1 is low, and the brightness of the pixels on the first side of the display area near the first centerline O1 is high. In addition, the brightness of the pixels located on the first side of the display area and on two sides of the first centerline O1 will be superimposed. As a result, the brightness of different positions on the first side of the display area will vary significantly, and the overall brightness uniformity of the display area is poor.

Based on this, in the display panel provided by this embodiment, d5 may be set to be less than d6. That is, the first extension part 110 may be set farther away from the second centerline O2 and closer to the third boundary C1, which means that the first extension part 110 is farther away from the first centerline O1 and closer to the first boundary A1, that is, d1≤d2. In this way, the brightness near the first centerline O1 on the first side of the display area and the vicinity of the first boundary A1 are equivalent, and the brightness uniformity of the entire display area is improved.

On the basis of the foregoing embodiments, optionally, in one embodiment of the present disclosure, the fifth distance d5 and the sixth distance d6 may satisfy the following condition: 0≤d5/d6≤14.11%.

In this embodiment, when d5/d6=14.11%, d1/d2=1, that is, d1=d2. When d5/d6=0, d1/d2=0. In this scenario, the first extension part 110 is located at the third boundary C1 and cannot be any closer to the first boundary A1 in the first direction.

In the above embodiment, the second extension part 111 and the first extension part 110 may be arranged symmetrically about the first centerline O1.

In addition, since the inconsistency of pixel brightness in different positions in the display area is mainly caused by the IR drop on the first power line 100, in order to improve the brightness uniformity of the entire display area, it is needed to reduce the resistance of each part of the first power line 100 as much as possible.

In one embodiment of the present disclosure, the height of the first body part 120 in the second direction may be reduced. More specifically, as shown in FIG. 10, in the second direction, first extension part 110 includes the first wire entry part 10 located between the bending area BA and the first part 121. In the second direction, the height of the first wire entry part 10 is the first height h1, and the height of the first body part 120 is the second height h2, where 72.28%≤h1/h2≤87.01%.

In this embodiment, the height h1 of the first wire entry part 10 in the second is used as a reference. The height h2 of the first body part 120 in the second direction can be reduced, such that h1/h2 gradually increases from 72.28% to 87.01%. Since the height of the first body part 120 in the second direction is reduced, the resistance of the first body part 120 can be reduced, thereby reducing the voltage drop loss of the first power line 100 on the first body part 120, and improving the overall brightness uniformity of the display area.

In practical applications, the part of the first power line 100 in the non-display area FA is generally a double-layer wiring. That is, the wirings in the two metal layers may be formed in parallel to reduce the resistance of the first power line in the non-display area, thereby reducing the IR (voltage) drop of the first power line in the non-display area. That is, the first body part may include a first sub-body part and a second sub-body par located on different metal layers. The projections of the first sub-body part and the second sub-body part on the plane where the display panel is located may substantially overlap, and may be connected in parallel through the holes between the metal layers. In this embodiment, reducing the height of the first body part 120 in the second direction can reduce the heights of the first sub-body part and the second sub-body part in the second direction at the same time.

More specifically, a brightness test of the 13 points (the 13 brightness test points shown in FIG. 1) is performed on the display area of the display panel provided in this embodiment, and the result shows that as h1/h2 increases from 72.28% to 87.01%, the brightness uniformity of the display area increases from 88.62% to 89.09%, and the brightness difference among the three points A, B, and C on the first side of the display area (the three points A, B, and C shown in FIG. 1) decreases from 1.10% to 0.37%.

Based on the foregoing embodiments, the first body part 120 can extend in the first direction, such that the difference in pixel brightness among different positions in the first direction on the first side of the display area is relatively small. However, limited by the wiring space, the first body part 120 may include the first part 121 and the 122 connected to each other in the second direction. The second direction may be parallel to the direction from the display area AA to the bending area BA. The second part 122 may be located on the side of the first part 121 near the display area AA, and in the first direction, the width of the first part 121 may be smaller than the width of the second part 122. In this scenario, the first extension part 110 needs to be located within the width of the first part 121 in the first direction. Therefore, in order to make the first extension part 110 closer to the first boundary A1 of the display area in the first direction, the width of the first part 121 in the first direction may need to be increased, and the distance between the first part 121 and the first boundary A1 of the display area in the first direction may need to be shortened.

Optionally, in one embodiment of the present disclosure, as shown in FIG. 2 and FIG. 10, the display panel further includes a second power line 200. The second power line 200 may be configured to provide a second power signal to the pixels PI in the display area AA. In some embodiments, the second power line may be a PVEE power line, and the second power signal may be a PVEE power signal.

As shown in FIG. 2 and FIG. 10, the second power line 200 includes a fifth extension part 210 located at least partially in the bending area BA, and a second body part 220 located in the non-display area FA and electrically connected to the fifth extension part 210. The second body part 220 is located between the bending area BA and the display area AA.

As shown in FIG. 2 and FIG. 10, the second power line 200 further includes a second fan-out part 230 located in the non-display area FA and electrically connected to the power pad pad1 and the fifth extension part 210, and s second auxiliary line 240 surrounding the display area. Only a part of the second auxiliary line 240 is shown in FIG. 2. In practical applications, the second auxiliary line 240 generally surrounds the display area AA.

As shown in FIG. 2 and FIG. 10, the second body part 220 extends in the first direction. In the first direction, the second body part 220 is located on the side of the first part 121 near the first boundary A1, and the fifth extension part 210 is located on the side of the first extension part 110 near the first boundary A1. In the first direction, the width of the second body part 220 is the first width $w1$, the width of the display area AA is the second width $w2$, and $13.77\% \leq w1/w2 \leq 19.29\%$.

Since the second body part 220 extends in the first direction, and in the first direction, the second body part 220 is located on the side of the first part 121 near the first boundary A1. Therefore, in the first direction, the first part 121 is restricted by the second body part 220 and cannot be closer to the first boundary A1 of the display area. Based on this, in the display panel provided by this embodiment, the second body part 220 may be shortened as much as possible in the direction towards the first boundary A1 of the display area, as far as the wiring space allows. More specifically, the ratio $w1/(w2/2)$ of the width $w1$ of the second body part 220 to the half width $w2/2$ of the display area AA may be reduced from 38.57% to 27.54%. That is, the ratio $w1/w2$ of the width 21 of the second body part 220 to the width $w2$ of the display area AA may be reduced from 19.29% to 13.77%. In this way, the third boundary C1 of the first part 121 can be closer to the first boundary A1 of the display area, then the first extension part 110 can also be closer to the first boundary A1 of the display area in the first direction, such that $d1 \leq d2$ and $d5 < d6$. Further, $0.7 \leq d1/d2 \leq 1$ and $0 \leq d5/d6 \leq 14.11\%$. In this way, the brightness of the pixels on the first side of the display area near the first boundary A1 can be improved, the difference between the brightness near the first centerline O1 on the first side of the display area and the brightness at the vicinity of the first boundary A1 can be reduced, and the brightness uniformity of the entire display area can be improved.

The width $w2$ of the display area AA in the first direction may be the distance between the first boundary A1 of the display area and the second boundary A2 of the display area in the first direction. The half width $w2/2$ of the display area AA in the first direction may be the distance between the first boundary A1 of the display area and the first centerline O1 of the display area in the first direction, which may also be equal to the distance between the second boundary A2 of the display area and the first centerline O1 of the display area in the first direction.

As shown in FIG. 10, the part, located in the bending area BA, of the fifth extension part 210 extending along the second direction in the second power line 200 is also as shown in FIG. 8A, which includes a plurality of traces arranged in sequence along the first direction, thereby reducing the stress of the second power line 200 in the bending area BA and ensuring stable transmission of the second power signal in the second power line 200.

On the basis of the foregoing embodiments, optionally, in one embodiment of the present disclosure, as shown in FIG. 10, in the first direction, the width of the first part 121 may be the third width, and $50.49\% \leq w5/w6 \leq 61.55\%$.

In this embodiment, the width $w3$ of the first part 121 in the first direction may be increased by shortening the second body part 220 as much as possible in the direction towards the first boundary A1 of the display area, as long as the wiring space allows. More specifically, in the first direction, the ratio of the width $w3$ of the first part 121 to the width $w2$ of the display area may be increased from 50.49% to 61.55%. As such, the third boundary C1 of the first part 121 can be closer to the first boundary A1 of the display area, such that the first extension part 110 can be closer to the first boundary A1 of the display area in the first direction, $d1 \leq d2$, and $d5 < d6$. Further, $0.7 \leq d1/d2 \leq 1$ and $0 \leq d5/d6 \leq 14.11\%$. In this way, the brightness of the pixels on the first side of the display area near the first boundary A1 can be improved, the difference between the brightness near the first centerline O1 on the first side of the display area and the brightness at the vicinity of the first boundary A1 can be reduced, and the brightness uniformity of the entire display area can be improved.

As shown in FIG. 10, the second body part 220 includes a third part 221 and a fourth part 222 that are connected to each other in the second direction, and the fourth part 222 is located on the side of the third part 221 near the display area AA. In the first direction, the width of the fourth part 222 is smaller than the width of the third part 221, and the fourth part 222 is located on the side of the third part 221 near the first boundary A1.

It can be seen that, in the first direction, not only the first part 121 of the first body part 120 is restricted by the second body part 220, but also the second part 122 of the first body part 120 is restricted by the second body part 220. More specifically, in the first direction, the first part 121 of the first body part 120 may be bounded by the third part 221 of the second body part 220, and the second part 122 of the first body part 120 may be bounded by the fourth part 222 of the second body part 220. When the wiring space allows, the second body part 220 may be shortened as close as possible to the first boundary A1 of the display area, such that the third part 221 and the fourth part 222 in the second body part 220 may be both closer to the first boundary A1 of the display area. In this way, not only the width of the first part 121 of the first body part 120 can be increased, but the width of the second part 122 of the first body part 120 can also be increased.

In one embodiment of the present disclosure, as shown in FIG. 10, in the first direction, the width of the second part 122 may be the fourth width, and $82.53\% \; w4/w2 \leq 86.00\%$.

In this embodiment, when the wiring space allows, after the second body part 220 is shortened as close as possible to the direction of the first boundary A1 of the display area, the width $w4$ of the second part 122 in the first direction may be increased. More specifically, in the first direction, the ratio of the width $w4$ of the second part 122 to the width $w2$ of the display area may be increased from 82.53% to 86.00%. That is, the second part 122 may be closer to the first boundary A1 of the display area in the first direction, thereby improving the brightness of the pixels on the first side of the display area near the first boundary A1, reducing the difference in pixel brightness at different positions on the first side of the display area in the first direction, and improving the brightness uniformity of the entire display area.

Based on the foregoing embodiments, the second body part 220 may include the third part 221 and the fourth part 222 connected to each other in the second direction. The fourth part 222 may be located on the side of the third part 221 near the display area AA. In the first direction, the width of the fourth part 222 may be smaller than the width of the third part 221, and the fourth part 222 may be located on the side of the second part 122 near the first boundary A1. In this way, in the first direction, the first part 121 of the first body part 120 may be bounded by the third part 221 of the second body part 220 and the second part 122 of the first body part 120 may be bounded by the fourth part 222 of the second body part 220. Based on this, when the wiring space allows, after the second body part 220 is shortened as close as possible to the direction of the first boundary A1 of the display area, the distance between the second part 122 of the first body part 120 and the first boundary A1 of the display area in the first direction may also be shortened.

In one embodiment of the present disclosure, as shown in FIG. 10, in the first direction, the minimum distance between the second part 122 and the first boundary A1 may be the seventh distance d7, and $3.50\% \leq d7/w2 \leq 4.37\%$.

In this embodiment, when the wiring space allows, after the second body part 220 is shortened as much as possible in the direction close to the first boundary A1 of the display area, the fourth part 222 of the second body part 220 may be shortened in a direction close to the first boundary A1 of the display area. In this way, the second part 122 of the first body part 120 may be closer to the first boundary A1 of the display area in the first direction. More specifically, in the first direction, the ratio of the minimum distance d7 between the second part 122 and the first boundary A1 to the half width (w2/2) of the display area may be reduced from 8.74% to 7.00%. That is, in the first direction, the ratio of the minimum distance d7 between the second part 122 and the first boundary A1 to the width w2 of the display area may be reduced from 4.37% to 3.5%. In this way, the second part 122 of the first body part 120 can be brought closer to the first boundary A1 of the display area, thereby improving the brightness of the pixels on the first side of the display area near the first boundary A1, reducing the difference in pixel brightness at different positions on the first side of the display area in the first direction, and improving the brightness uniformity of the entire display area.

Based on the foregoing embodiments, the second body part 220 may include the third part 221 and the fourth part 222 connected to each other in the second direction. The fourth part 222 may be located on the side of the third part 221 near the display area AA. In the first direction, the width of the fourth part 222 may be smaller than the width of the third part 221, and the fourth part 222 may be located on the side of the second part 122 near the first boundary A1. In this way, in the first direction, the first part 121 of the first body part 120 may be bounded by the third part 221 of the second body part 220 and the second part 122 of the first body part 120 may be bounded by the fourth part 222 of the second body part 220. Based on this, when the wiring space allows, after the second body part 220 is shortened as close as possible to the direction of the first boundary A1 of the display area, the minimum distance in the first direction between the second part 122 of the first body part 120 and the fourth part 222 of the second body part 220 may also be shortened.

In one embodiment of the present disclosure, as shown in FIG. 10, in the first direction, the minimum distance between the second part 122 and the fourth part 222 may be the eighth distance d8, and $0.043\% \leq d8/w2 \leq 1.79\%$.

In this embodiment, when the wiring space allows, after the second body part 220 is shortened as much as possible in the direction towards the first boundary A1 of the display area, the fourth part 222 of the second body part 220 may approach the first boundary A1 of the display area. Therefore, if the width w4 of the second part 122 of the first body part 120 is not changed, the minimum distance d8 between the second part 122 and the fourth part 222 in the first direction will increase. If the width w4 of the second part 122 of the first body part 120 in the first direction is increased, the minimum distance d8 between the second part 122 and the fourth part 222 will decrease. That is, the minimum distance d8 between the second part 122 and the fourth part 222 in the first direction may also reflect the width w4 of the second part 122 in the first direction.

More specifically, when the wiring space allows, after the second body part 220 is shortened as much as possible in the direction towards the first boundary A1 of the display area, the ratio of the width w1 of the second body part 220 to the width w2 of the display area may be increased from 13.77% to 19.29%. In this scenario, the ratio of the minimum distance d8 between the second part 122 of the first body part 120 and the fourth part 222 of the second body part 220 in the first direction to the half width (w2/2) of the display area may increase from 1.39% to 3.57%. That is, the ratio of the minimum distance d8 between the second part 122 of the first body part 120 and the fourth part 222 of the second body part 220 in the first direction to the width w2 of the display area may increase from 0.70% to 1.79%.

Further, after increasing the width w4 of the second part 122 of the first body part 120 in the first direction, more specifically, in the first direction, after increasing the ratio of the width w4 of the second part 122 of the first body part 120 to the width w2 of the display area from 82.53% to 86.00%, the ratio of the minimum distance d8 between the second part 122 of the first body part 120 and the fourth part 222 of the second body part 220 in the first direction to the half width (w2/2) of the display area may be reduced from 3.57% to 0.086%. That is, the ratio of the minimum distance d8 between the second part 122 of the first body part 120 and the fourth part 222 of the second body part 220 in the first direction to the width w2 of the display area may be reduced from 1.79% to 0.043%.

Therefore, compared to when the second body part 220 is not shortened in the first direction and the second part 122 of the first body part 120 is not widened in the first direction, after the second body part 220 is shortened in the first direction and the second part 122 of the first body part 120 is widened in the first direction, the minimum distance d8 between the second part 122 of the first body part 120 and the second part 122 of the second body part 220 can also be reduced. Even if the minimum distance d8 between the second part 122 of the first body part 120 and the second part 122 of the second body part 220 is simply reduced, the second part 122 of the first body part 120 can be made closer to the first boundary A1 of the display area in the first direction. In this way, the brightness of the pixels on the first side of the display area near the first boundary A1 can be improved, the difference in pixel brightness among different positions on the first side of the display area in the first direction can be reduced, and the brightness uniformity of the entire display area can be improved.

In the foregoing embodiments, only the arrangement of the first power line 100 and the second power line 200 near the first boundary A1 of the display area is described. the arrangement of the first power line 100 and the second power line 200 near the second boundary A2 of the display area is similar to the arrangement near the first boundary A1 of the display area, and details are not repeated here.

Based on the foregoing embodiments, restricted by the second body part 220 of the second power line 200 in the first direction, when the first body part 120 extends in the first direction, the first body part 120 cannot extend to the first boundary A1 and the second boundary A2 of the display area along the first direction without limitation. More specifically, as shown in FIG. 10, the first body part 120 includes the first part 121 and the second part 122 connected to each other in the second direction. The second direction is parallel to the direction from the display area AA to the bending area BA. The second part 122 is located on the side of the first part 121 near the display area AA, and in the first direction, the width of the first part 121 is smaller than the width of the second part 122.

In practical applications, even if the second part 122 of the first body part 120 is not restricted by the second body part 220 (especially the fourth part 222) in the first direction, the second part 122 will be restricted by other signal lines and cannot extend to the first boundary A1 of the display area, such that the second part 122 of the first body part 120 needs to be cut off at a distance from the first boundary A1.

In order to be able to transmit the first power signal to the pixel on the first side of the display area near the first boundary A1, in the conventional display panel, the first power line 100 needs to extend from the end of the second part 122 near the first boundary A1 of the display area to the inside of the display area AA. From the inside of the display area AA the first power line 100 needs to extend to the first boundary A1 of the display area to transmit the first power signal to the pixels on the first side of the display area near the first boundary A1. However, in this case, the part of the first power line 100 extending from the end of the second part 122 near the first boundary A1 of the display area to the first boundary A1 of the display area will be coupled with other signal lines inside the display area AA, which generates a voltage drop loss, which is not beneficial to the brightness uniformity of the entire display area.

Figure 11:
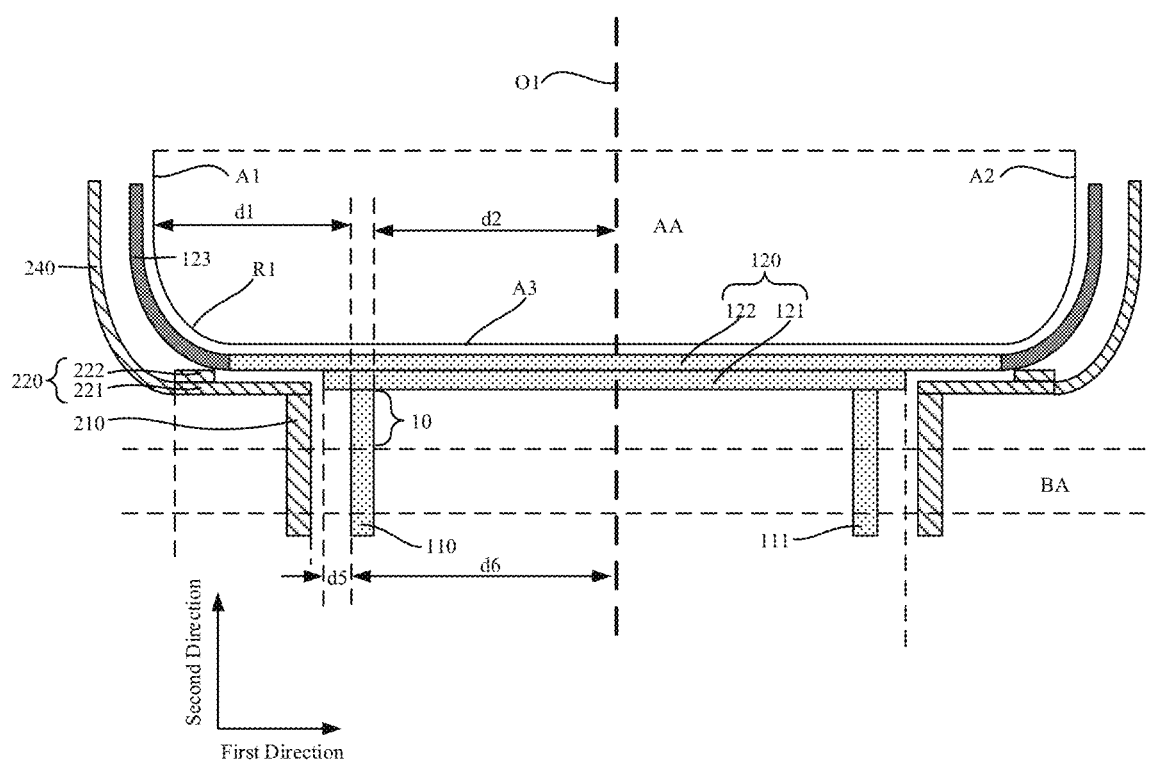
FIG. 11 is an enlarged schematic plan view of a display panel according to another embodiment of the present disclosure.

Based on this, in one embodiment of the present disclosure, as shown in FIG. 11, the display area AA further includes a fifth boundary A3 connecting the first boundary A1 and the second boundary A2. The fifth boundary A3 is located on the first side of the display area AA, and the fifth boundary A3 and the first boundary A1 are connected by a first connection corner R1 (also referred to as an R corner). The first body part 120 further includes a fifth part 123. The fifth part 123 extends from one end of the second part 122 near the first boundary A1 along the first connection corner R1 to be parallel to the second direction. The second part 122 includes a first subsection at the first metal layer and a second subsection at the second metal layer.

Figure 12:
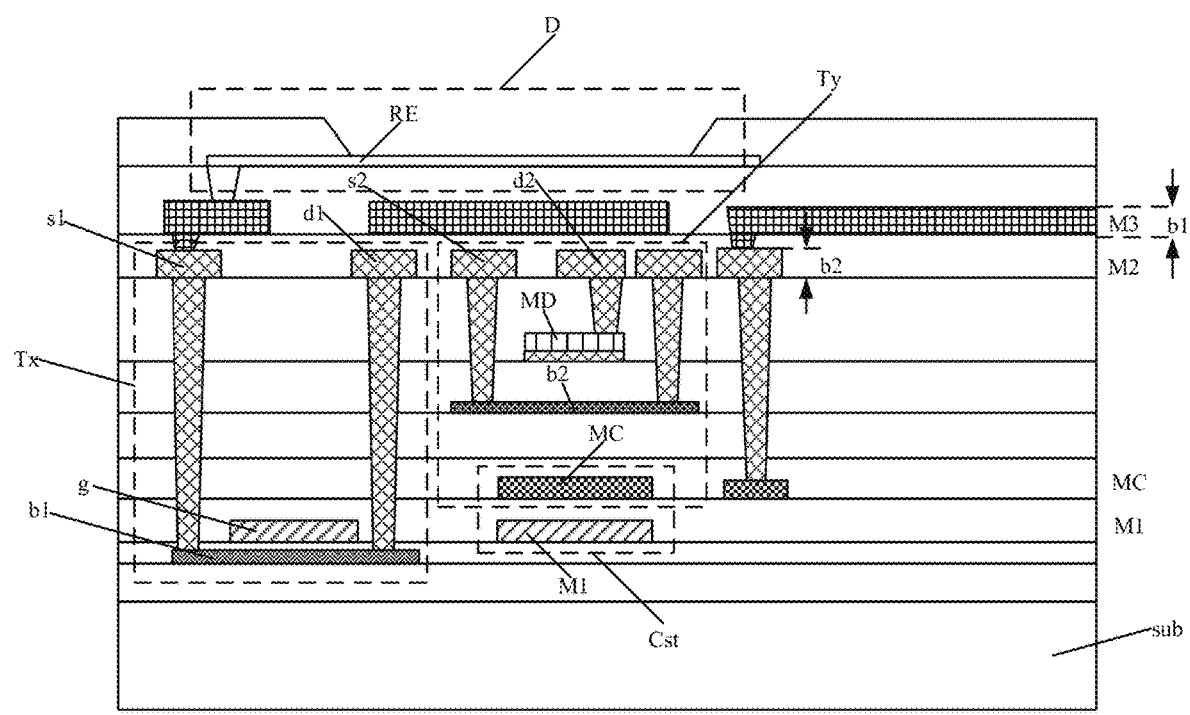
FIG. 12 is a schematic cross-sectional view of a display panel according to an embodiment of the present disclosure.

In order to better understand the hierarchical relationship between the metal layer where the second part 122 is located and the metal layer where the fifth part 123 is located in the display panel provided in this embodiment, FIG. 12 provides a schematic cross-sectional view of the display panel in this embodiment. As shown in FIG. 12, the display panel includes a substrate sub, and thin film transistors Tx and Ty, a capacitor Cst, a light-emitting element D, etc. located on the substrate sub. In some embodiments, Tx may be a low temperature polycrystalline oxide (LTPO) thin film transistor, and Tx includes an active layer b1, a gate g, a source s1, and a drain d1. Ty may be an indium gallium zinc oxide (IGZO) thin film transistor, and Ty includes an active layer b2, a double gate (including a top gate MD and a bottom gate MC), a source S2, and a drain d2. The capacitor Cst includes a first plate M1 and a second plate MC. The light-emitting element D includes an anode RE, an organic light-emitting layer OM, and a cathode SE. The organic light-emitting layer OM and the cathode SE are not shown in FIG. 12. The thin film transistor Ty described above may be used as a gate reset transistor T4 in the pixel circuit shown in FIG. 4, and the thin film transistor Tx described above may be used as other transistors except the gate reset transistor in the pixel circuit shown in FIG. 4. The capacitor Cst may be used as the capacitor Cst in the pixel circuit shown in FIG. 4.

As shown in FIG. 12, the substrate sub includes multiple metal layers (M1, MC, M2, and M3), and each metal layer may be used as an electrode of a transistor or a signal line. In this embodiment, the first metal layer may be the M3 layer, and the second metal layer may be the M2 layer. That is, the first subsection in the second part 122 may be located at the M3 layer, and the second subsection in the second part 122 may be located at the M2 layer. The first subsection and the second subsection may be connected in parallel through the vias between the M2 layer and the M3 layer, such that the resistance of the second part 122 can be relatively small.

In practical applications, the second power line 200 located in the non-display area is generally also forming by connecting the lines in two metal layers in parallel. In addition, the two metal layers where the second power line 200 is located are generally the same as the two metal layers where the first power line 100 is located, and are also the M2 layer and the M3 layer. As a result, the end of the second part 122 of the first body part 120 near the first boundary A1 is restricted by the fourth part 222 of the second body part 220, such that the second part 122 of the first body part 120 cannot extend to the first connection corner R1.

Further, the non-display area adjacent to the first boundary A1 of the display area and the non-display area adjacent to the second boundary A2 are generally provided with gate driving circuits. The driver IC also needs to send drive signals to the gate driving circuits through the pins in the pad area PA. The leads (located in the M3 layer) that transmit these driving signals need to be connected from the first connection corner R1 to the gate driving circuits, which further restrict the second part 122 of the first body part 120 in the first direction.

It can be seen from the above analysis that in the first direction, the second part 122 cannot continue to extend to the first boundary A1 because the M3 metal layer at the first connection corner R1 needs to be provided with the second power line 200 and the signal line connected to the gate driving circuits, and there is no space to further arrange the first power line 100.

Based on this, in the display panel provided by the embodiments of the present disclosure, the fifth part 123 is provided. Since the fifth part 123 can be located on the second metal layer (the M2 layer), and the second metal layer (the M2 layer) and the first metal layer (the M3 layer) can be disposed on different layers, the fifth part 123 will not be affected by the second metal layer (the M2 layer) by the fourth part 222 located on the first metal layer (the M3 layer) and other signal lines. In this way, the fifth part 123 can extend from one end of the second part 122 near the first boundary A1 along the first connection corner R1 to be parallel to the second direction, such that the first power line 100 can provide the first power signal for the pixels on the first side of the display area near the first boundary A1.

In addition, since the second subsection in the second part 122 can also be located in the second metal layer (the M2 layer), and the fifth part 123 can be located in the same metal layer, therefore, the second subsection in the second part 122 can be connected with the same metal layer as the fifth part 123. Although the first subsection in the second part 122 is located in the first metal layer (the M3 layer), which is a different layer than the fifth part 123, since the first subsection located in the first metal layer (the M3 layer) and the second subsection located in the second metal layer (the M2 layer) can be connected in parallel in second part 122 through the vias between the first metal layer (the M3 layer) and the second metal layer, the first subsection in the second part 122 can be connected to the fifth part 123 by connecting with the second subsection of the second part 122.

Consistent with the present disclosure, by swapping the first subsection of the second part 122 located in the first metal layer (the M3 layer) to the fifth part 123 located in the second metal layer (the M2 layer), the first power line 100 can extend from one end of the second part 122 near the first boundary A1 along the first connection corner R1 to be parallel to the second direction. In this way, the first power line 100 will not extend from the end of the second part 122 near the first boundary A1 to the inside of the display area AA, and then extend to the first boundary A1 of the display area. As a result, the first power line 100 will not be coupled with other signal lines inside the display area AA, thereby reducing the voltage drop loss caused by the coupling of the first power line 100 with other signals lines, and improving the overall brightness uniformity of the display area.

More specifically, a brightness test of the 13 points (the 13 brightness test points shown in FIG. 1) is performed on the display area of the display panel provided in this embodiment, and the result shows that by arranging the fifth part 123 extending to the first connection corner R1, the brightness difference among the three points A, B, and C on the first side of the display area (the three points A, B, and C shown in FIG. 1) decreased from 1.10% to 0.92%.

On the basis of the foregoing embodiments, optionally, in one embodiment of the present disclosure, as shown in FIG. 2, the first power line 100 further includes a plurality of first auxiliary lines 140 located in the display area AA.

In this embodiment, as shown in FIG. 12, the first auxiliary lines 140 are located in the first metal layer (the M3 layer), that is, in the first power line 100. The first auxiliary lines 140 and the first subsection located in the first metal layer (the M3 layer) in the second part 122 are disposed in the same layer, and are disposed in different layers from the fifth part 123 located in the second metal layer (the M2 layer).

In this embodiment, since the first auxiliary lines 140 and the first subsection located on the first metal layer (the M3 layer) in the second part 122 are disposed in the same layer, the first auxiliary lines 140 and the second part 122 located in the first metal layer (the M3 layer) in the second part 122 can be directly connected in the same layer. In addition, since the first subsection located in the first metal layer (the M3 layer) and the second subsection located in the second metal layer (the M2 layer) in the second part 122 are connected in parallel through the vias between the pass through between the first metal layer (the M3 layer) and the second metal layer (the M2 layer) in the second part 122, the second subsection in the second part 122 can be connected to the first auxiliary lines 140 by connecting with the first subsection in the second part 122.

Since the first auxiliary lines 140 and the fifth part 123 located in the second metal layer (the M2 layer) are disposed on different layers, the first auxiliary lines 140 located in the first metal layer (the M3 layer) and the fifth part 123 located in the second metal layer (the M2 layer) may need to be connected through vias between the first metal layer (the M3 layer) and the second metal layer (the M2 layer). More specifically, when the fifth part 123 enters the display area AA, the fifth part 123 may need to be switched to the first auxiliary lines 140 located in the first metal layer (the M3 layer) through the vias.

Figure 13:
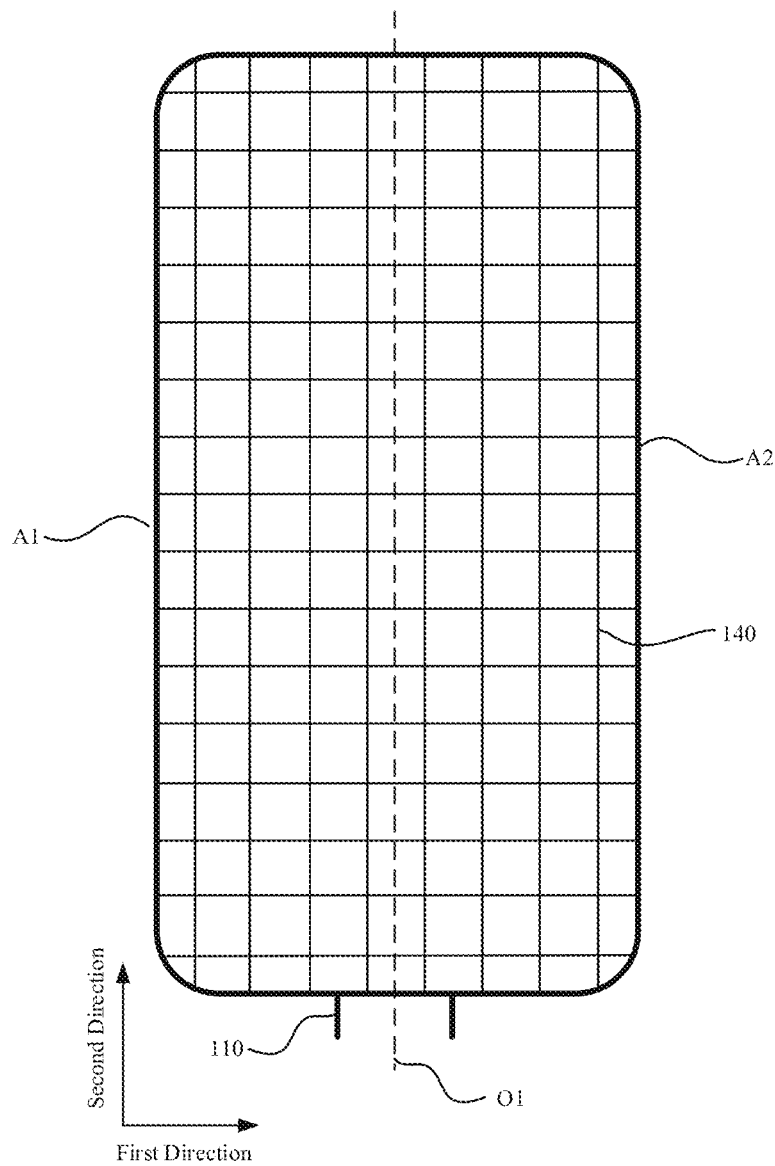
FIG. 13 is a schematic diagram showing a distribution of a plurality of first auxiliary lines of a first power line in a display area of a display panel according to an embodiment of the present disclosure.

In FIG. 2, only some of the plurality of first auxiliary lines 140 are shown for clarity. FIG. 13 shows a schematic diagram of the distribution of the plurality of first auxiliary lines 140 of the first power line 100 in the display area. In view of FIG. 2 and FIG. 13, it can be seen that the plurality of first auxiliary lines 140 may include some first auxiliary lines 140 extending in the first direction, and some first auxiliary lines 140 extending in the second direction. The plurality of first auxiliary lines 140 may form the grid structure shown in FIG. 13, but the present disclosure does not limit the arrangement of the plurality of first auxiliary lines 140 in the display area, which can be set based on actual needs.

As shown in FIG. 10, in the second direction, the first extension part 110 includes the first wire entry part 10 located between the bending area BA and the first part 121. In practical applications, the first wire entry part 10 in the first extension part 110, and the first part 121 and the second part 122 in the first body part 120 may be all composed of traces located in the first metal layer (the M3 layer) and traces located in the second metal layer (the M2 layer) in parallel. In addition, in the previous embodiment, the plurality of first auxiliary lines 140 in the display area may be located in the first metal layer (the M3 layer), and the fifth part 123 in the first extension part 110 may be located in the second metal layer (the M2 layer).

The part of the first extension part 110 located in the bending area BA may include only the traces located in the first metal layer (the M3 layer), or may be composed of traces located in the first metal layer (the M3 layer) and traces located in the second metal layer (the M2 layer) connected in parallel, which can be set based on actual needs.

In order to reduce the resistance of the first power line 100, in some embodiments, the thickness of the first metal layer (the M3 layer) may be increased. More specifically, as shown in FIG. 12, the thickness b1 of the first metal layer may satisfy the following condition: 6500 Å≤b1≤7500 Å.

The thickness b1 of the first metal layer (the M3 layer) may be increased from 6500 Å to 7500 Å, thereby reducing the resistance of the first power line 100, reducing the voltage drop of the first power line 100, and improving the overall brightness uniformity of the display area.

In some embodiments, the thickness b2 of the second metal layer (the M2 layer) may be increased. More specifically, as shown in FIG. 12, the thickness b2 of the second metal layer satisfy the following condition: 6500 Å≤b1≤7500 Å.

The thickness b2 of the second metal layer (the M2 layer) may be increased from 6500 Å to 7500 Å, thereby reducing the resistance of the first power line 100, reducing the voltage drop of the first power line 100, and improving the overall brightness uniformity of the display area.

In some embodiments, the thickness of the first metal layer (the M3 layer) and the thickness of the second metal layer (the M2 layer) may be increased at the same time. More specifically, as shown in FIG. 12, the thickness b1 of the first metal layer satisfy the following condition: 6500 Å≤b1≤7500 Å, and the thickness b2 of the second metal layer satisfy the following condition: 6500 Å≤b1≤7500 Å, thereby further reducing the resistance of the first power line 100, reducing the voltage drop of the first power line 100, and improving the overall brightness uniformity of the display area.

More specifically, a brightness test on the 13 points (the 13 brightness test points shown in FIG. 1) is performed on the display area of the display panel provided in this embodiment, and the result shows that as the thickness b1 of the first metal layer (the M3 layer) and the thickness b2 of the second metal layer (the M2 layer) both increase from 6500 Å to 7500 Å, the brightness difference among the three points A, B, and C on the first side of the display area (the three points A, B, and C shown in FIG. 1) decreased from 5.84% to 5.51%, and the overall brightness uniformity of the display area increased from 86.31% to 87.39%.

In one embodiment of the present disclosure, as shown in FIG. 2, the first power line 100 further includes a plurality of first auxiliary lines 140 located in the display area.

In this embodiment, the first auxiliary lines 140 may include a first trace and a second trace that may be electrically connected to each other. The first trace may be located in the first metal layer, the second trace may be located in a third metal layer, and the first metal layer and the third metal layer may be disposed in different layers.

In this embodiment, the first auxiliary lines 140 may not include a trace located in a single metal layer, but include the first trace located in the first metal layer and the second trace located in the third metal layer electrically connected to each other. In some embodiments, the first metal layer may be the M3 layer in FIG. 12, and the third metal layer may be the M2 layer, the MC layer, or another metal layer in FIG. 12, More specifically, the first trace located in the first metal layer (the M3 layer) and the second trace located in the third metal layer (such as the M2 layer or the MC layer) may be connected in parallel through the vias between the first metal layer and the third metal layer, thereby reducing the resistance of the first auxiliary lines 140 in the display area, reducing the voltage drop on the first auxiliary lines 140, and improving the brightness uniformity of the display area.

In this embodiment, the first subsection, located in the first metal layer (the M3 layer), of the second part 122 and the first trace, located in the first metal layer (the M3 layer), of the first auxiliary lines 140 may be disposed in the same layer, therefore, the second part 122 may be connected to the first trace of the same layer at the first metal layer (the M3 layer).

When the third metal layer and the second metal layer are arranged in the same layer, that is, the third metal layer and the second metal layer are both the M2 layer, in this scenario, the fifth part 123 located in the second metal layer (the M2 layer) and the second trace located in the third metal layer (also the M2 layer) in the first auxiliary lines 140 may be arranged in the same layer. The fifth part 123 may be directly connected to the second trace on the same layer in the first auxiliary lines 140 at the second metal layer (the M2 layer).

When the third metal layer and the second metal layer are disposed in different layers, that is, the fifth part 123 is located on the second metal layer (the M2 layer) and the second trace in the first auxiliary lines 140 is located in the third metal layer (e.g., the MC layer) that is different from the second metal layer, in this scenario, the fifth part 123 located in the second metal layer (the M2 layer), the first trace located in the first metal layer (the M3 layer), and the second trace located in the third metal layer (e.g., the MC layer) may all be set in different layers. The fifth part 123 may be connected to the first trace in the first auxiliary lines 140 through vias between the second metal layer (the M2 layer) and first metal layer (the M3 layer), and/or connected to the second trace in the first auxiliary lines 140 through vias between the second metal layer (the M2 layer) and the third metal layer (e.g., the MC layer).

In any of the foregoing embodiments, the second direction may be parallel to the direction from the display area AA to the bending area BA, which means that the second direction may be substantially parallel to the direction from the display area AA to the bending area BA. That is, if the angle between the second direction and the direction from the display area AA to the bending area BA is smaller than a preset angle, the second direction may be considered to be parallel to the direction from the display area AA to the bending area BA.

Figure 14:
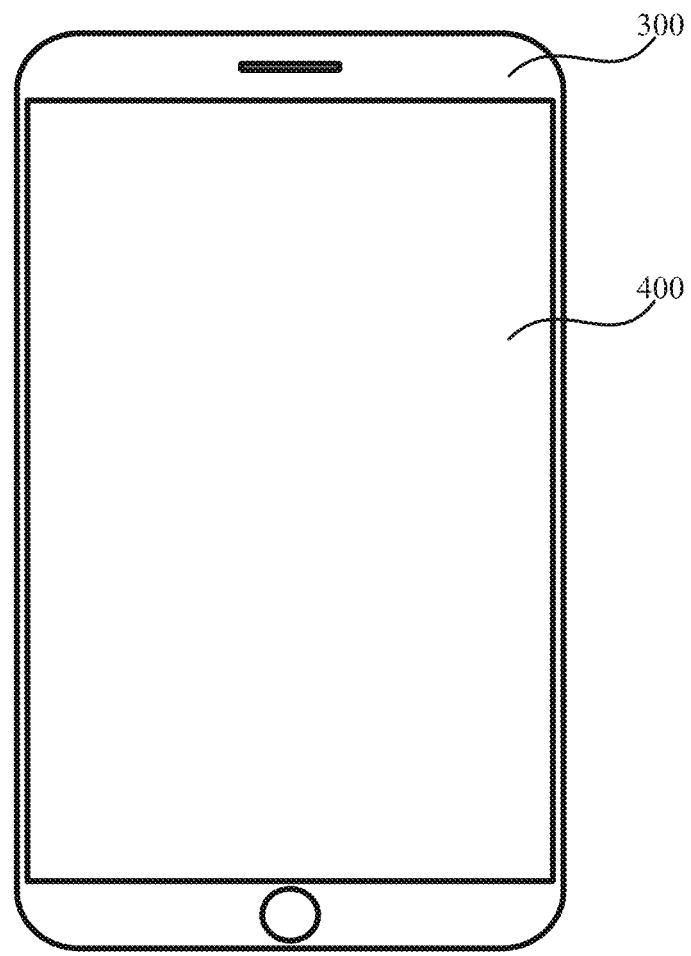
FIG. 14 is a schematic structural diagram of an electronic device according to an embodiment of the present disclosure.

An embodiment of the present disclosure further provides a display device 300. As shown in FIG. 14, the display device 300 includes a display panel 400. The display panel 400 may be the display panel described in any of the foregoing embodiments. Since the display panel has been described in detail in the foregoing embodiments, it will not be repeated here.

The display device may be any electronic device with a display function, such as a touch screen, a mobile phone, a tablet computer, a notebook computer, an electronic paper book, or a TV.

In the conventional display panel, the first extension part is closer to the first centerline, that is d1>d2, the brightness of the pixels on the first side of the display area near the first boundary is low, the brightness of the pixels on the first side of the display area near the first centerline is high, and the brightness difference is large. In the display panel provided by the embodiments of the present disclosure, the minimum distance d1 between the first extension part and the first boundary can be set to be less than or equal to the minimum distance d2 between the first extension part and the first centerline, that is, d1≤d2, thereby reducing the distance between the pixels on the first side of the display area close to the first boundary and the first extension part, reducing the voltage drop from the first extension part to the pixels on the first side of the display area close to the first boundary, and improving the brightness of the pixels on the first side of the display area. In addition, since the brightness of the pixels on the first side of the display area and on two sides of the first centerline will be superimposed near the first centerline, even if d1≤d2, the brightness near the first centerline and the first boundary on the first side of the display area can be made equivalent, and the brightness uniformity of the entire display area can be improved.

The embodiments in this specification are described in a progressive manner, each embodiment emphasizes a difference from the other embodiments, and the identical or similar parts between the embodiments may be made to reference each other.

The above description of the disclosed embodiments enables those having ordinary skills in the art to implement or use the present disclosure. Other embodiments of the disclosure will be apparent to those skilled in the art from consideration of the specification and practice of the embodiments disclosed herein. It is intended that the specification and examples be considered as example only and not to limit the scope of the disclosure, with a true scope and spirit of the invention being indicated by the following claims.

What is claimed is:

1. A display panel comprising:
 a display area including a plurality of pixels;
 a non-display area surrounding the display area, the non-display area including a bending area located on a first side of the display area; and a power line configured to provide a power signal to the plurality of pixels in the display area, the power line including:
an extension part located at least partially in the bending area; and
a body part located in the non-display area and electrically connected to the extension part, the body part being located between the bending area and the display area;
wherein:
the display area includes:
a first boundary and a second boundary opposite to each other in a first direction; and
a centerline extending in a second direction pointing from the display area to the bending area and intersecting the first direction; and
in the first direction, a minimum distance d1 between the extension part and the first boundary is smaller than a minimum distance between the extension part and the second boundary, and d1 is smaller than or equal to a minimum distance d2 between the extension part and the centerline.

2. The display panel of claim 1, wherein $0.7 \leq d1/d2 \leq 1$.

3. The display panel of claim 1, wherein:
the extension part is a first extension part;
the power line further includes a second extension part at least partially located in the bending area, the second extension part being electrically connected to the body part; and
in the first direction, a minimum distance between the second extension part and the first boundary is greater than a minimum distance d3 between the second extension part and the second boundary, and d3 is equal to d1 and is smaller than or equal to a minimum distance d4 between the second extension part and the first centerline.

4. The display panel of claim 3, wherein:
the power line further includes a third extension part at least partially located in the bending area and a fourth extension part at least partially located in the bending area, the third extension part and the fourth extension part both being electrically connected to the body part; and
in the first direction, the third extension part and the fourth extension part are located between the first extension part and the second extension part, a minimum distance between the first extension part and the third extension part being equal to a minimum distance between the second extension part and the fourth extension part.

5. The display panel of claim 4, wherein:
in the first direction, a width of the third extension part is larger than a width of the first extension part, and a width of the fourth extension part is larger than a width of the second extension part.

6. The display panel of claim 3, wherein:
in the first direction, a width of the first extension part is equal to a width of the second extension part.

7. The display panel of claim 1, wherein:
the centerline is a first centerline;
the body part extends in the first direction and includes a first part and a second part connected to each other in the second direction, the second part being located on a side of the first part near the display area, the first part including a third boundary and a fourth boundary opposite to each other in the first direction, the third boundary being located on a side of the fourth boundary near the first boundary, and the first part further including a second centerline extending along the second direction;
in the first direction, a width of the first part is smaller than a width of the second part; and
in the first direction, a minimum distance d5 between the extension part and the third boundary is smaller than a minimum distance d6 between the extension part and the second centerline.

8. The display panel of claim 7, wherein $0 \leq d5/d6 \leq 14.11\%$.

9. The display panel of claim 7, wherein:
in the first direction, a distance between the first centerline and the second centerline is less than a preset distance.

10. The display panel of claim 7, wherein:
in the second direction, the extension part includes a wire entry part located between the bending area and the first part; and
in the second direction, a height h1 of the wire entry part and a height h2 of the body part satisfy $72.28\% \leq h1/h2 \leq 87.01\%$.

11. The display panel of claim 1,
wherein:
the power line is a first power line, the power signal is a first power signal, the extension part is a first extension part, and the body part is a first body part;
the body part extends in the first direction and includes a first part and a second part connected to each other in the second direction, the second part being located on a side of the first part near the display area; and
in the first direction, a width of the first part is smaller than a width of the second part;
the display panel further comprising:
a second power line configured to provide a second power signal to the plurality of pixels in the display area and including:
a second extension part located at least partially in the bending area, in the first direction, the second extension part being located on a side of the first extension part near the first boundary; and
a second body part located in the non-display area and electrically connected to the second extension part, the second body part being located between the bending area and the display area, the second body part extending in the first direction, and in the first direction, the second body part being located on a side of the first part near the first boundary;
wherein in the first direction, a width w1 of the second body part and a width w2 of the display area satisfy $13.77\% \leq w1/w2 \leq 19.29\%$.

12. The display panel of claim 11, wherein:
in the first direction, a width w3 of the first part satisfies $50.49\% \leq w3/w2 \leq 61.55\%$.

13. The display panel of claim 11, wherein:
the second body part includes a third part and a fourth part connected to each other in the second direction, the fourth part being located on a side of the third part near the display area;
in the first direction, a width of the fourth part is smaller than a width of the third part, the fourth part being located on a side of the second part near the first boundary; and
in the first direction, a width w4 of the second part satisfies $82.53\% \leq w4/w2 \leq 86.00\%$.

14. The display panel of claim 11, wherein:
the second body part includes a third part and a fourth part connected to each other in the second direction, the fourth part being located on a side of the third part near the display area;
in the first direction, a width of the fourth part is smaller than a width of the third part, and the fourth part is located on a side of the second part near the first boundary; and
in the first direction, a minimum distance d7 between the second part and the first boundary satisfies $3.50\% \leq d7/w2 \leq 4.37\%$.

15. The display panel of claim 11, wherein:
the second body part includes a third part and a fourth part connected to each other in the second direction, the fourth part being located on a side of the third part near the display area;
in the first direction, a width of the fourth part is smaller than a width of the third part, and the fourth part is located on a side of the second part near the first boundary; and
in the first direction, a minimum distance d8 between the second part and the fourth part satisfies $0.043\% \leq d8/w2 \leq 1.79\%$.

16. The display panel of claim 1, wherein:
the body part extends in the first direction and includes a first part and a second part connected to each other in the second direction, the second part being located on a side of the first part near the display area;
in the first direction, a width of the first part is smaller than a width of the second part;
the display area further includes a third boundary connecting the first boundary and the second boundary, the third boundary being located on the first side of the display area, and third boundary and the first boundary being connected through a connection corner;
the body part further includes a third part extending from one end of the second part near the first boundary along the connection corner to be parallel to the second direction; and
the second part includes a first subsection located in a first metal layer and a second subsection located in a second metal layer, the first subsection and the second subsection being electrically connected to each other, the third part being located in the second metal layer, and the first metal layer and the second metal layer being arranged in different layers.

17. The display panel of claim 16, wherein:
the power line further includes a plurality of auxiliary lines located in the display area; and
the plurality of auxiliary lines are located in the first metal layer.

18. The display panel of claim 16, wherein:
a thickness of the first metal layer is less than or equal to 7500 Å and greater than equal to 6500 Å.

19. The display panel of claim 16, wherein:
the power line further includes a plurality of auxiliary lines located in the display area and each including a first trace and a second trace electrically connected to each other, the first trace being located in the first metal layer, the second trace being located in a third metal layer, the first metal layer and the third metal layer being disposed in different layers.

20. A display electronic device comprising:
a display panel including:
a display area including a plurality of pixels;
a non-display area surrounding the display area, the non-display area including a bending area located on a first side of the display area; and
a power line configured to provide a power signal to the plurality of pixels in the display area, the power line including:
an extension part located at least partially in the bending area; and
a body part located in the non-display area and electrically connected to the extension part, the body part being located between the bending area and the display area;
wherein:
the display area includes:
a first boundary and a second boundary opposite to each other in a first direction; and
a centerline extending in a second direction pointing from the display area to the bending area and intersecting the first direction; and
in the first direction, a minimum distance d1 between the extension part and the first boundary is smaller than a minimum distance between the extension part and the second boundary, and d1 is smaller than or equal to a minimum distance d2 between the extension part and the centerline.

* * * * *